US009406868B2

United States Patent
Kohda et al.

(10) Patent No.: US 9,406,868 B2
(45) Date of Patent: Aug. 2, 2016

(54) MANUFACTURING METHOD FOR PIEZOELECTRIC RESONATOR DEVICE

(71) Applicant: DAISHINKU CORPORATION, Kakogawa-shi (JP)

(72) Inventors: Naoki Kohda, Kakogawa (JP); Hiroki Yoshioka, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 195 days.

(21) Appl. No.: 14/057,076

(22) Filed: Oct. 18, 2013

(65) Prior Publication Data

US 2014/0047687 A1 Feb. 20, 2014

Related U.S. Application Data

(62) Division of application No. 13/129,182, filed on May 25, 2011, now abandoned.

(30) Foreign Application Priority Data

Dec. 24, 2008 (JP) .................................. 2008-326851

(51) Int. Cl.
*H01L 41/332* (2013.01)
*H01L 41/23* (2013.01)
(Continued)

(52) U.S. Cl.
CPC .......... *H01L 41/332* (2013.01); *H01L 23/3731* (2013.01); *H01L 23/3732* (2013.01); *H01L 23/3733* (2013.01); *H01L 31/18* (2013.01); *H01L 31/1804* (2013.01); *H01L 41/23* (2013.01); *H01L 41/25* (2013.01); *H01L 41/29* (2013.01); *H01L 41/33* (2013.01);
(Continued)

(58) Field of Classification Search
CPC ......... H01L 41/23; H01L 41/25; H01L 41/29; H01L 41/33; H01L 41/332; H01L 31/18; H01L 31/1804; H01L 23/3731; H01L 23/3732; H01L 23/3733; H03H 3/02; H03H 2003/045; H03H 2003/0457; H03H 9/0547; H03H 9/0552; H03H 9/1035; H03H 9/19; B01D 2325/02; C23C 8/40; C23C 12/00; Y10T 29/42
See application file for complete search history.

(56) References Cited

U.S. PATENT DOCUMENTS

| | | | | |
|---|---|---|---|---|
| 5,412,160 A | * | 5/1995 | Yasumoto | H01L 23/3731 174/258 |
| 6,590,315 B2 | * | 7/2003 | Beaver | H03H 9/1035 310/348 |
| 2002/0135429 A1 | * | 9/2002 | Akagawa | H03H 9/0552 331/68 |

FOREIGN PATENT DOCUMENTS

JP 2007306434 A * 11/2007

*Primary Examiner* — A. Dexter Tugbang
(74) *Attorney, Agent, or Firm* — Mots Law, PLLC

(57) ABSTRACT

A manufacturing method for a piezoelectric resonator device includes sequential steps of: (i) laminating a metal film constituted by at least two types of metals on at least one of a substrate of a joining region of a piezoelectric resonator plate, a substrate of a region of an upper lid member, and a substrate of a region of a lower lid member; (ii) promoting metal diffusion inside the metal film by heat processing; and (iii) roughening a surface of the substrate of the at least one of the piezoelectric resonator plate, the upper lid member, and the lower lid member by performing wet etching with an etchant caused to penetrate into the metal film and thereby forming a large number of micropores in the surface of the substrate of the at least one of the piezoelectric resonator plate, the upper lid member, and the lower lid member.

6 Claims, 17 Drawing Sheets

(51) Int. Cl.
*H03H 3/02* (2006.01)
*H01L 41/25* (2013.01)
*H01L 41/29* (2013.01)
*H01L 41/33* (2013.01)
*H01L 31/18* (2006.01)
*H03H 9/05* (2006.01)
*H01L 23/373* (2006.01)
*H03H 9/10* (2006.01)
*H03H 9/19* (2006.01)
*C23C 8/40* (2006.01)
*C23C 12/00* (2006.01)
*H03H 3/04* (2006.01)

(52) U.S. Cl.
CPC .............. *H03H 3/02* (2013.01); *H03H 9/0547* (2013.01); *H03H 9/0552* (2013.01); *H03H 9/1035* (2013.01); *H03H 9/19* (2013.01); *B01D 2325/02* (2013.01); *C23C 8/40* (2013.01); *C23C 12/00* (2013.01); *H03H 2003/045* (2013.01); *H03H 2003/0457* (2013.01); *Y10T 29/42* (2015.01)

Roughened surface region — Crystal substrate — Mirror surface region

Roughened surface — Crystal substrate

MANUFACTURING METHOD FOR PIEZOELECTRIC RESONATOR DEVICE

This application is a continuation of application Ser. No. 13/129,182, filed on May 13, 2011, which is based upon and claims the benefit of priority from the prior Japanese Patent Application No. 2008-326851, filed on Dec. 24, 2008, the entire contents of which is incorporated herein by reference.

TECHNICAL FIELD

The present invention relates to a piezoelectric resonator device used in electronic equipment or the like, a manufacturing method for a piezoelectric resonator device, and a method for etching a constituent member of a piezoelectric resonator device.

BACKGROUND ART

A package used in a surface-mount crystal resonator is constituted by joining a crystal resonator plate to the interior of a box-like container having an opening in the top, and thereafter hermetically sealing the opening with a lid. The container is generally a burning body of ceramics.

In recent years, although microminiaturization of various electronic devices is under way, there is a limit to the burning accuracy of a microminiaturized burning body of ceramics. When a burning body of ceramics such as described is miniaturized, ceramic burning displacement becomes apparent, and such burning displacement has influence such as poor hermeticity on the burning body of ceramics. For this reason, burning displacement cannot be ignored.

Currently, Patent Documents 1 and 2 disclose crystal resonators having a configuration in which a container and lids such as described are constituted by a pair of crystal plates, for example, and a crystal resonator plate formed by integrating a resonating portion where an excitation electrode is formed with a frame portion formed along the outer periphery of the resonating portion is sandwiched between the pair of crystal plates, with the joining material in between.

In the crystal resonators according to Patent Documents 1 and 2, the surfaces of the upper and lower lids (pair of crystal plates) and the surface of the crystal resonator plate undergo mirror finishing, and the lids and the crystal resonator plate are joined directly to one another (interatomic bonding). Equipment for implementing interatomic bonding as referred to herein is expensive, so the crystal resonators according to Patent Documents 1 and 2 increase the manufacturing cost.

Patent Document 3 discloses another crystal resonator different from the crystal resonators described in Patent Documents 1 and 2, in which upper and lower lids constituted by a pair of crystal plates and a crystal resonator plate, such as described, are joined directly to one another. In the crystal resonator according to Patent Document 3, the surfaces of the upper and lower lids (pair of crystal plates) and the surface of the crystal resonator plate undergo mirror finishing as in the case of the crystal resonators according to Patent Documents 1 and 2, and are formed as flat smooth surfaces having very little unevenness. Under such surface conditions of the upper and lower lids and the crystal resonator plate, it is difficult to obtain enough joining strength in joining the surfaces of the upper and lower lids and the surface of the crystal resonator plate to the joining material.

PRIOR ART DOCUMENT

Patent Document

[Patent Document 1] JP 6-303080A
[Patent Document 2] JP 6-310971A
[Patent Document 3] Publication of Japanese Patent No. 3319221

SUMMARY OF INVENTION

Problem to be Solved by the Invention

The present invention has been conceived in light of the above-described problems, and it is an object of the present invention to provide a piezoelectric resonator device that improves the joining strength between a joining material and constituent members of the piezoelectric resonator device and reduces the manufacturing cost, a manufacturing method for such a piezoelectric resonator device, and a method for etching the constituent members of the piezoelectric resonator device.

Means for Solving the Problems

In order to achieve the object described above, the piezoelectric resonator device according to the present invention includes a piezoelectric resonator plate where an excitation electrode is formed; and an upper lid member and a lower lid member that hermetically seal the excitation electrode, the piezoelectric resonator plate having a joining region where the upper lid member is joined and a joining region where the lower lid member is joined, on front and back main surfaces, the upper lid member having a joining region on one main surface where the piezoelectric resonator plate is joined, the lower lid member having a joining region on one main surface where the piezoelectric resonator plate is joined and a joining region on the other main surface where an external member is joined, wherein a joining layer constituting a joining material is formed in each of the joining region of the piezoelectric resonator plate, the joining region of the upper lid member, and the joining region of the lower lid member, the joining region of the piezoelectric resonator plate and the joining region of the upper lid member are joined to each other via the joining material, the joining region of the piezoelectric resonator plate and the joining region of the lower lid member are joined to each other via the joining material, and at least one of a substrate of the joining region of the piezoelectric resonator plate, a substrate of the joining region of the upper lid member, and a substrate of the joining region of the lower lid member has a roughened surface.

With such a piezoelectric resonator device, the substrate of the joining region of a constituent member of the piezoelectric resonator device has a roughened surface, so micro-unevenness formed by surface roughening of the substrate of the joining region functions as "wedges" against horizontal stress. That is, a so-called anchor effect is produced and improves the joining strength between the roughened substrate surface of the joining region and the joining material. Consequently, according to the piezoelectric resonator device of the present invention, hermeticity can be increased with the improved joining strength between the joining material and the constituent member of the piezoelectric resonator device, and also the manufacturing cost can be reduced because interatomic bonding that was required regarding joining in the conventional technology is not an absolute necessity.

Moreover, in order to achieve the object described above, another piezoelectric resonator device according to the present invention includes a piezoelectric resonator plate where an excitation electrode is formed; and an upper lid member and a lower lid member that hermetically seal the excitation electrode, the upper lid member having a joining region on one main surface where the lower lid member is joined, the lower lid member having a joining region on one main surface where the upper lid member is joined and a joining region on the other main surface where an external member is joined, wherein a joining layer constituting a joining material is formed in each of the joining region of the upper lid member and the joining region of the lower lid member, the joining region of the upper lid member and the joining region of the lower lid member are joined to each other via the joining material, and at least one of a substrate of the joining region of the upper lid member and a substrate of the joining region of the lower lid member has a roughened surface.

With such a piezoelectric resonator device, the substrate of the joining region of at least one of the upper lid member and the lower lid member has a roughened surface, so micro-unevenness formed by surface roughening of the substrate of the joining region functions as "wedges" against horizontal stress. That is, a so-called anchor effect is produced and improves the joining strength between the roughened substrate surface of the joining region and the joining material. Consequently, with the piezoelectric resonator device according to the present invention, hermeticity can be increased with the improved joining strength between the joining material and the constituent member of the piezoelectric resonator device, and also the manufacturing cost can be reduced because interatomic bonding that was required regarding joining in the conventional technology is not an absolute necessity.

Alternatively, in the above configuration, the lower lid member may have a joining region on one main surface where the piezoelectric resonator plate is joined, and a substrate of the joining region of the lower lid member where the piezoelectric resonator plate is joined may have a roughened surface.

In this case, the lower lid member has a joining region on one main surface where the piezoelectric resonator plate is joined, and a substrate of the joining region where the piezoelectric resonator plate is joined has a roughened surface, so micro-unevenness formed by surface roughening of the substrate of the joining region functions as "wedges" against horizontal stress. That is, a so-called anchor effect is produced and improves the joining strength between the roughened substrate surface of the joining region and the joining material.

Alternatively, in the above configuration, the joining layer formed on the roughened surface of the substrate of the joining region may have a roughened surface. In this case, since the joining layer formed on the roughened surface of the substrate of the joining region also has a roughened surface, for example when a plated layer is further formed using electrolytic plating techniques on the roughened surface of the joining layer formed on the substrate of the joining region, an anchor effect occurs between the plated layer and the joining layer having a roughened surface and improves mechanical strength in the case of temporarily joining the upper lid member, the lower lid member, and the piezoelectric resonator plate by ultrasonic waves.

Alternatively, in the above configuration, the substrate of the joining region of the piezoelectric resonator plate may have a roughened surface, the substrate of the joining region of at least one of the upper lid member and the lower lid member may have a roughened surface, and the substrate of the joining region of at least one of the upper lid member and the lower lid member may be formed to have a rougher surface than the substrate of the joining region of the piezoelectric resonator plate.

According to such a configuration, performing surface roughening on at least one of the upper lid member and the lower lid member, rather than on the piezoelectric resonator plate where the excitation electrode or the like is formed, simplifies the surface roughening process. In the case of performing surface roughening on the crystal resonator plate where a metal film (electrode film) such as an excitation electrode is formed, it is necessary to protect the electrode film, and in addition, various degrees of thermal hysteresis to be applied to the crystal resonator plate can possibly affect the conditions of the electrode film. On the other hand, the upper lid member and the lower lid member have no such an excitation electrode formed, so it is possible to reduce the influences to be expected on various properties of the piezoelectric resonator device. Roughening the substrate of the joining region of at least one of the upper lid member and the lower lid member, together with a resultant anchor effect acting on the joining material, produces a piezoelectric resonator device with favorable properties.

Alternatively, in the above configuration, the joining region of at least one of the upper lid member and the lower lid member may have a roughened surface, and the joining region having a roughened surface may be formed wider inwardly of the one main surface in plan view than the joining region of the piezoelectric resonator plate.

According to such a configuration, for example when the upper lid member, the lower lid member, and the piezoelectric resonator plate are joined to one another by heating and melting the joining layer constituting the joining material, the fluid joining material (joining layer) is prevented from flowing toward the inside of the piezoelectric resonator device. More specifically, a fillet of the joining material is more easily formed toward the joining region (surface-roughened region) of at least one of the upper lid member and the lower lid member that is formed wider inwardly. This fillet provides stronger joining between the piezoelectric resonator plate and at least one of the upper lid member and the lower lid member. That is, a forming region of the joining material where a fillet is to be formed can be controlled by controlling the surface-roughened region of at least one of the upper lid member and the lower lid member.

Alternatively, in the above configuration, the main surface entirely of at least one of the upper lid member and the lower lid member may be roughened.

With the above configuration, the main surface entirely of at least one of the upper lid member and the lower lid member is roughened. Thus, for example when an electrode pattern that is electrically connected to an external connection terminal connected to external devices is formed on the main surface side of at least one of the upper lid member and the lower lid member, the entirely roughened surface improves the adhesion of the electrode pattern to the main surface. This simplifies the surface roughening process and improves productivity as compared with the case of selectively performing surface roughening on only a region where the electrode pattern is formed.

Alternatively, in the above configuration, the joining region of the piezoelectric resonator plate may have a roughened surface, a multi-surface joining portion for joining the joining material to a plurality of surfaces having different planar directions may be provided in the vicinity of the joining region of at least one of the upper lid member and the lower lid member, and an enlargement preventing portion for preventing a region where the joining material is joined from being enlarged may be provided outside the multi-surface joining portion.

According to the above configuration, the roughened surface of the joining region of the piezoelectric resonator plate produces an anchor effect between the piezoelectric resonator plate and the joining material and accordingly improves the joining strength between the piezoelectric resonator plate and the joining material. In addition, the provision of the multi-surface joining portion and the enlargement preventing portion in the vicinity of the joining region of at least one of the upper lid member and the lower lid member prevents the joining material from spreading in the main surface direction (planar direction) on the joining surface (one main surface) of at least one of the upper lid member and the lower lid member provided with the multi-surface joining portion and the enlargement preventing portion, when at least one of the upper lid member and the lower lid member provided with the multi-surface joining portion and the enlargement preventing portion is joined to the piezoelectric resonator plate via the joining material.

More specifically, according to the above configuration, the provision of the multi-surface joining portion in at least one of the upper lid member and the lower lid member enables the joining material to be joined to a plurality of surfaces having different planar directions, thus producing an anchor effect and improving the strength of joining with the joining material.

Also, the spread of the joining material (wetting) at a joining site (joining region) is a natural phenomenon occurring in heat-melt joining of the joining material. However, with the above configuration, the provision of the multi-surface joining portion in the vicinity of the joining region of at least one of the upper lid member and the lower lid member and the provision of the enlargement preventing portion outside the multi-surface joining portion prevent the joining material from flowing to (wetting) the end face of the piezoelectric resonator device and from penetrating into the internal space of the piezoelectric resonator device, even if the joining material spreads at the joining site after joining using the joining material.

Moreover, in order to achieve the object described above, the manufacturing method for a piezoelectric resonator device according to the present invention is a manufacturing method for a piezoelectric resonator device comprising a piezoelectric resonator plate where an excitation electrode is formed, and an upper lid member and a lower lid member that hermetically seal the excitation electrode, the piezoelectric resonator plate having a joining region where the upper lid member is joined and a joining region where the lower lid member is joined on front and back main surfaces, the upper lid member having a joining region on one main surface where the piezoelectric resonator plate is joined, the lower lid member having a joining region on one main surface where the piezoelectric resonator plate is joined, wherein the joining region of the piezoelectric resonator plate and the joining region of the upper lid member are joined to each other via a joining material, and the joining region of the piezoelectric resonator plate and the joining region of the lower lid member are joined to each other via a joining material. The manufacturing method includes a metal film formation step of laminating a metal film constituted by at least two types of metals on a substrate of the joining region of at least one of the piezoelectric resonator plate, the upper lid member, and the lower lid member, a diffusion step of promoting metal diffusion inside the metal film by heat processing after the metal film formation step, and an etching step of roughening a surface of the substrate by performing wet etching with an etchant caused to penetrate into the metal film obtained after the diffusion step and thereby forming a large number of micropores in the surface of the substrate.

With the above manufacturing method, part of one main surface of a constituent member whose surface conditions are like a mirror finished surface having very little unevenness can be roughened. More specifically, a region not to be roughened is covered and thereby protected with a resin or the like, whereas a large number of micropores are formed in the substrate surface of a region to be roughened by not forming a protective film such as a resist and causing an etchant to penetrate into the substrate surface of the constituent member through the metal film (diffusion layer) where metal diffusion has occurred. This enables selective surface roughening. Consequently, with the manufacturing method for a piezoelectric resonator device according to the present invention, hermeticity can be increased with the improved joining strength between the joining material and the constituent members of the piezoelectric resonator device, and also the manufacturing cost of the piezoelectric resonator device can be reduced because interatomic bonding that was required regarding joining in the conventional technology is not an absolute necessity.

Alternatively, in the above configuration, the layer constituting the metal film may have a varying thickness. In this case, it is possible to control the amount of metal to be diffused by heat processing and accordingly control the formation of the micropores in the substrate surface caused by an etchant penetrating into the metal film after the diffusion step. That is, roughened surface conditions can be controlled.

In the above manufacturing method, the upper lid member and the lower lid member may be made of crystal or glass, the piezoelectric resonator plate may be made of crystal, the metal film formation step may involve forming the metal film by forming a Cr layer on the substrate of at least one of the upper lid member, the lower lid member, and the piezoelectric resonator plate and laminating an Au layer on the Cr layer, so as to form a two-layer configuration of the Cr layer and the Au layer, and the diffusion step may involve roughening the surface of the substrate by diffusing Cr in the Cr layer into Au in the Au layer, performing wet etching using an etchant that is corrosive to the Cr and the crystal, and thereby forming a large number of micropores in the surface of the substrate.

In this case, outer formation by wet etching is easy because the upper lid member and the lower lid member are made of crystal or glass and the piezoelectric resonator plate is made of crystal. In addition, the configuration of the metal film is a two-layer configuration of the Cr layer and the Au layer laminated one above the other. With such a film configuration, the use of crystal for the upper lid member and the lower lid member, for example, provides good adhesion to the piezoelectric resonator plate. In addition, the use of Au that is resistant to the etchant allows the etchant to penetrate into the substrate of the member where the metal film is formed without causing corrosion of the metal film, even if wet etching is performed through the metal film in which the Cr has been diffused. This produces a large number of micropores in the surface of the substrate under the metal film where metal diffusion has occurred and accordingly roughens the substrate surface.

Moreover, in order to achieve the object described above, the method for etching a constituent member of a piezoelectric resonator device according to the present invention is a method for etching a constituent member of a piezoelectric resonator device that has a joining region on at least one main surface where an external member is joined. The etching method includes a metal film formation step of laminating a metal film constituted by at least two types of metals on a substrate of the joining region of the constituent member, a diffusion step of promoting metal diffusion inside the metal film by heat processing after the metal film formation step, and an etching step of roughening a surface of the substrate by performing wet etching with an etchant caused to penetrate into the metal film obtained after the diffusion step and thereby forming a large number of micropores in the surface of the substrate.

According to the above etching method, part of the main surface of at least one constituent member whose surface conditions are like a mirror finished surface having very little unevenness can be roughened. More specifically, a region not to be roughened is covered and thereby protected with a resin or the like, whereas a large number of micropores are formed in the substrate surface of a region to be roughened by not forming a protective film such as a resist and causing an etchant to penetrate into the substrate surface of the constituent member through the metal film (diffusion layer) in which metal diffusion has occurred. This enables selective surface roughening. Consequently, for example in the case of a piezoelectric resonator device using a piezoelectric resonator plate, an upper lid member, and a lower lid member as constituent members and holding the piezoelectric resonator plate between the upper lid member and the lower lid member via the joining material, the joining strength between the piezoelectric resonator plate and the joining material, the joining strength between the upper lid member and the joining material, and the joining strength between the lower lid member and the joining material can be improved with the etching method according to the present invention. In addition, the manufacturing cost of the piezoelectric resonator device can be reduced because interatomic bonding that was required regarding joining in the conventional technology is not an absolute necessity.

Effects of the Invention

As described above, with the piezoelectric resonator device, the manufacturing method for the piezoelectric resonator device, and the method for etching a constituent member of a piezoelectric resonator device according to the present invention, it is possible to improve the joining strength between the joining material and a constituent member of the piezoelectric resonator device (e.g., the piezoelectric resonator plate and the upper and lower lid members) and reduce the manufacturing cost of the piezoelectric resonator device.

DESCRIPTION OF REFERENCE NUMERALS

Figure 1:
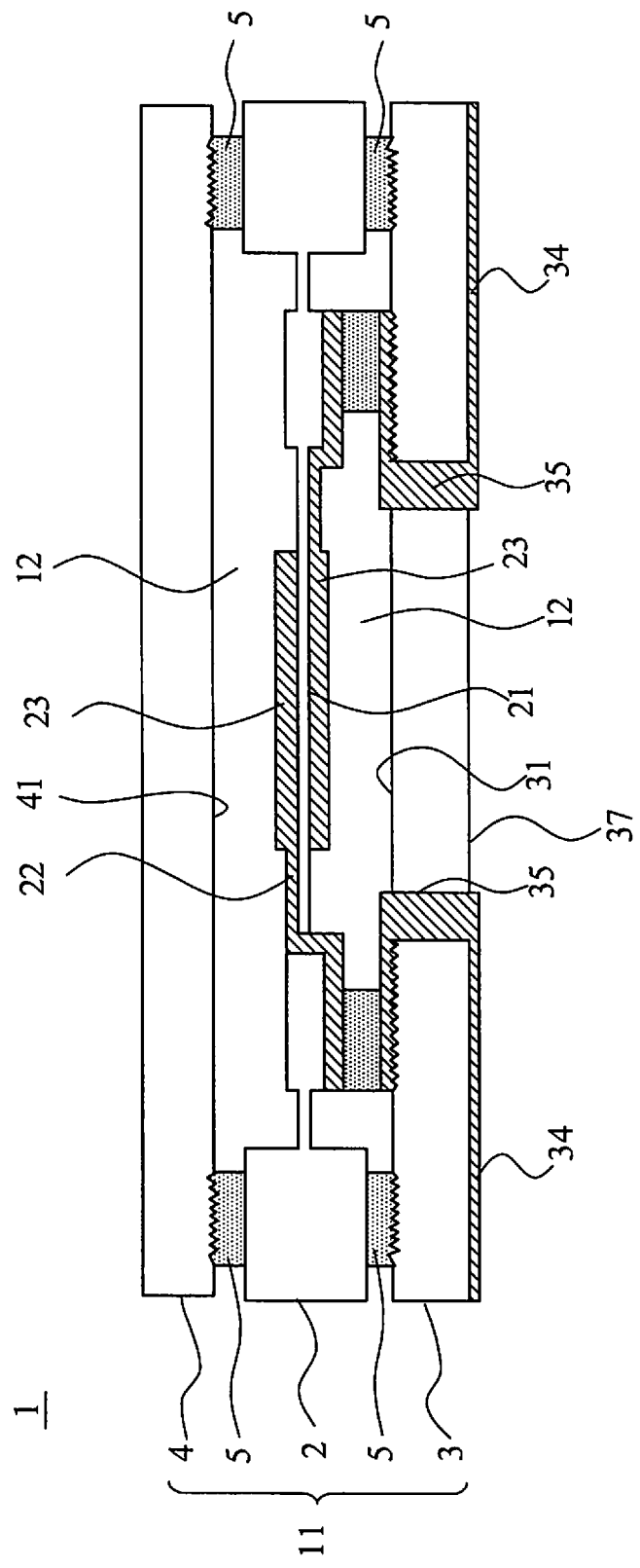
FIG. 1 is a schematic cross-sectional view of a crystal resonator taken along the long side thereof according to Embodiment 1 of the present invention.

1 Crystal resonator
2 Crystal resonator plate
20 Resonating portion
23 Excitation electrode
3 Lower lid member
4 Upper lid member
5 Joining material
50 Au-plated layer
51 First joining material
52 Second joining material
53 Third joining material
54 Fourth joining material 6 Protrusion
7 Recess
8 Groove

MODE FOR CARRYING OUT THE INVENTION

Embodiment 1

Figure 2:
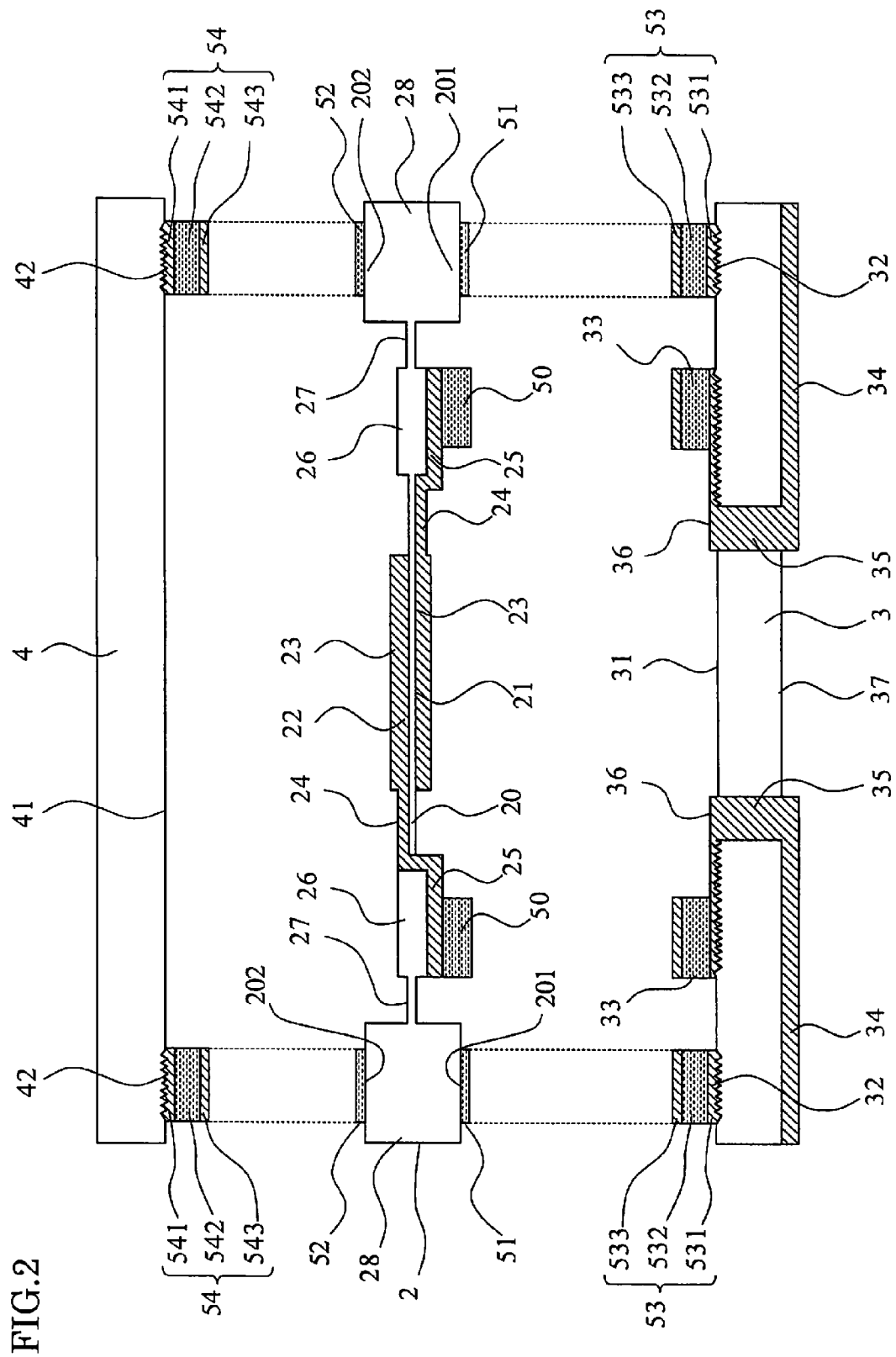
FIG. 2 is a schematic configuration diagram showing constituent members of the crystal resonator according to Embodiment 1 of the present invention.

The following is a description of Embodiment 1 according to the present invention with reference to the drawings. Note that a description is given in the following Embodiment 1 of the case where the present invention is applied to a crystal resonator as a piezoelectric resonator device. FIG. 1 is a cross-sectional view of a crystal resonator 1 taken along the long side of a crystal resonator plate 2 according to Embodiment 1, and FIG. 2 is a schematic configuration diagram showing constituent members of the crystal resonator 1 shown in FIG. 1.

As shown in FIG. 1, the main constituent members of the crystal resonator 1 according to Embodiment 1 include the crystal resonator plate 2 (a piezoelectric resonator plate according to the present invention), a lower lid member 3 that hermetically seals an excitation electrode 23 formed on one main surface 21 of the crystal resonator plate 2, and an upper lid member 4 that hermetically seals an excitation electrode 23 formed on the other main surface 22 of the crystal resonator plate 2.

The crystal resonator 1 is constituted by a package 11 formed by joining the crystal resonator plate 2 and the lower lid member 3 with a joining material 5 and joining the crystal resonator plate 2 and the upper lid member 4 with a joining material 5. Joining the lower lid member 3 and the upper lid member 4 via the crystal resonator plate 2 produces two internal spaces 12 in the package 11, and the excitation electrodes 23 formed on both of the main surfaces 21 and 22 of the crystal resonator plate 2 are hermetically sealed in the respective internal spaces 12.

The lower lid member 3 and the upper lid member 4 have substantially the same shape and substantially the same outer dimensions. An external connection terminal 34 is formed on the underside (the other main surface) 37 of the lower lid member 3, and a conducting path (via) 35 that is electrically connected to the external connection terminal 34 is formed through the lower lid member 3 along the thickness between both of the main surfaces 31 and 37.

First, a description of the main constituent members of the crystal resonator 1 will be given, followed by a description of a manufacturing method for the crystal resonator 1.

As shown in FIG. 2, the crystal resonator plate 2 is a AT-cut crystal plate that is cut out at a predetermined angle. The crystal resonator plate 2 includes a thin-walled resonating portion 20 where the excitation electrode 23 is formed, a rim portion 26 surrounding the resonating portion 20, a frame portion 28, and a thin-walled portion 27, all of which are integrally formed. The frame portion 28 as referred to herein annularly encircles the resonating portion 20 and the rim portion 26 and is formed thicker than the resonating portion 20 and the rim portion 26. The thin-walled portion 27 is formed thinner than the rim portion 26 between the rim portion 26 and the frame portion 28.

The crystal resonator plate 2 (the resonating portion 20, the rim portion 26, the thin-walled portion 27, and the frame portion 28) is formed by wet etching, and the excitation electrodes 23 are formed opposed to each other on the front and back faces (one main surface 21 and the other main surface 22) of the resonating portion 20, using vapor deposition techniques. In Embodiment 1, the excitation electrodes 23 are formed in a film configuration of the order of Cr and Au from the bottom on the front and back main surfaces (one main surface 21 and the other main surface 22) of the resonating portion 20. Note that the film configuration of the excitation electrodes 23 is not intended to be limited thereto and may be other film configurations. In addition, extraction electrodes 24 are formed by being derived from the excitation electrodes 23. The extraction electrode 24 extracted from the other main surface 22 is derived from a boundary portion between the resonating portion 20 and the rim portion 26 through the resonating portion 20 along the thickness between the other main surface 22 and the one main surface 21. Then, a first joining electrode 25 is formed at the end portion of the extraction electrode 24. An Au-plated layer 50 is formed over the first joining electrode 25.

Both of the main surfaces 21 and 22 of the crystal resonator plate 2 undergo mirror finishing and are formed as flat smooth surfaces. In the crystal resonator plate 2, both main surfaces 201 and 202 of the frame portion 28 are constituted as joining faces (joining regions) of the lower lid member 3 and the upper lid member 4, and the resonating portion 20 is constituted as a resonating region. A first joining material 51 to be joined to the lower lid member 3 is formed on the one main surface 201 of the frame portion 28. Also, a second joining material 52 as a joining layer to be joined to the upper lid member 4 is formed on the other main surface 202 of the frame portion 28. The first joining material 51 and the second joining material 52 are formed to substantially the same width, and the first joining material 51 and the second joining material 52 have the same film configuration. The first joining material 51 and the second joining material 52 are configured by laminating a plurality of metal films on both of the main surfaces 201 and 202 of the frame portion 28. In Embodiment 1, the first joining material 51 and the second joining material 52 are configured by forming a Cr layer (not shown) and an Au layer (not shown) in order from the lowermost, using vapor deposition techniques, and then laminating an Au-plated layer (not shown) on those layers, using electrolytic plating techniques.

As shown in FIG. 2, the lower lid member 3 is a flat plate that is rectangular in plan view, and a Z plate of crystal is used therefor. The lower lid member 3 has substantially the same outer dimensions as the crystal resonator plate 2 in plan view. The lower lid member 3 has a joining region (specifically, a joining surface 32) where the crystal resonator plate 2 is joined on one main surface 31. The joining surface 32 is an outer peripheral and surrounding region along the outer periphery of the one main surface 31 of the lower lid member 3. Also, a second joining electrode 33 is formed on the one main surface 31 of the lower lid member 3. The second joining electrode 33 is joined to the first joining electrode 25 of the crystal resonator plate 2 via the Au-plated layer 50.

A third joining material 53 as a joining layer to be joined to the crystal resonator plate 2 is formed on the joining surface 32 of the lower lid member 3. More specifically, the third joining material 53 is formed by laminating a plurality of metal films on the joining surface 32, that is, by forming a Cr layer (not shown) and an Au layer 531 by vapor deposition in order from the lowermost layer side, laminating an Au—Sn alloy layer 532 thereon, and further laminating an Au flash-plated layer 533 thereon. Alternatively, the third joining material 53 may be formed by forming a Cr layer and an Au layer by vapor deposition in order from the undersurface side and laminating a Sn-plated layer and an Au-plated layer in sequence thereon. Note that the third joining material 53 and the above-described second joining electrode 33 are formed at the same time, so the second joining electrode 33 and the third joining material 53 have the same configuration. The third joining material 53 is formed to substantially the same width as the first joining material 51. Also, as shown in FIG. 2, the via 35 for providing conduction between the excitation electrodes 23 of the crystal resonator plate 2 and external devices is formed in the lower lid member 3. An electrode pattern 36 is formed through this via 35 from the second joining electrode 33 formed on the one main surface 31 of the lower lid member 3 to the external connection terminal 34 formed on the other main surface 37.

The joining region (specifically, the joining surface 32) of the one main surface 31 (substrate) of the lower lid member 3 and a region thereof where the electrode pattern 36 is formed have a roughened surface. A region of the one main surface 31 other than the region having a roughened surface has a flat smooth surface (mirror-finished surface). In an initial state, the entire one main surface 31 of the lower lid member 3 is a flat smooth surface (mirror-finished surface), and the joining region (substrate) thereof is made to have a roughened surface through surface roughening (discussed later). Note that, in order to clearly show such roughened-surface conditions of the one main surface 31 of the lower lid member 3 in the description of Embodiment 1, unevenness of the roughened surface region (joining region) is shown in an emphasized manner in FIGS. 1 and 2.

As shown in FIG. 2, the upper lid member 4 is a flat plate that is rectangular in plan view, and a Z plate of crystal is used therefor, similarly to the lower lid member 3. The upper lid member 4 has substantially the same outer dimensions as the crystal resonator plate 2 in plan view. The upper lid member 4 has a joining region (specifically, a joining surface 42) where the crystal resonator plate 2 is joined on one main surface 41. The joining surface 42 is an outer peripheral and surrounding region along the outer periphery of the one main surface 41 of the upper lid member 4. Only the joining surface 42 of the one main surface 41 (substrate) of the upper lid member 4 has a roughened surface, and a region of the one main surface 41 other than the region having a roughened surface has a flat smooth surface (mirror-finished surface). In an initial state, the entire one main surface 41 of the upper lid member 4 has a flat smooth surface (mirror-finished surface). However, the joining region (substrate) is made to have a roughened surface through surface roughening (discussed later). Note that, in order to clearly show such roughened-surface conditions of the one main surface 41 of the upper lid member 4 in the description of Embodiment 1, unevenness of the roughened surface region (joining region) is shown in an emphasized manner in FIGS. 1 and 2.

A fourth joining material 54 as a joining layer to be joined to the crystal resonator plate 2 is formed on the joining surface 42 of the upper lid member 4. More specifically, the fourth joining material 54 is formed by laminating a plurality of metal films on the joining surface 42, that is, by forming a Cr layer (not shown) and an Au layer 541 by vapor deposition in order from the lowermost layer side, laminating an Au—Sn alloy layer 542 thereon, and further laminating an Au flash-plated layer 543 thereon. Alternatively, the fourth joining material 54 may be formed by forming a Cr layer and an Au layer by vapor deposition in order from the undersurface side and laminating a Sn-plated layer and an Au-plated layer in sequence thereon. The fourth joining material 54 is formed to substantially the same width as the second joining material 52.

In the crystal resonator 1 with the above-described configuration, the joining region (seal path) of the first joining material 51 formed on the joining surface of the crystal resonator plate 2 (the one main surface 201 of the frame portion 28), and the joining region (seal path) of the third joining material 53 formed on the joining surface 32 of the lower lid member 3 have the same width. Also, the joining region (seal path) of the second joining material 52 formed on the joining surface of the crystal resonator plate 2 (the other main surface 202 of the frame portion 28), and the joining region (seal path) of the fourth joining material 54 formed on the joining surface 42 of the upper lid member 3 have the same width.

The above has been a description of the main constituent members of the crystal resonator 1.

Figure 3:
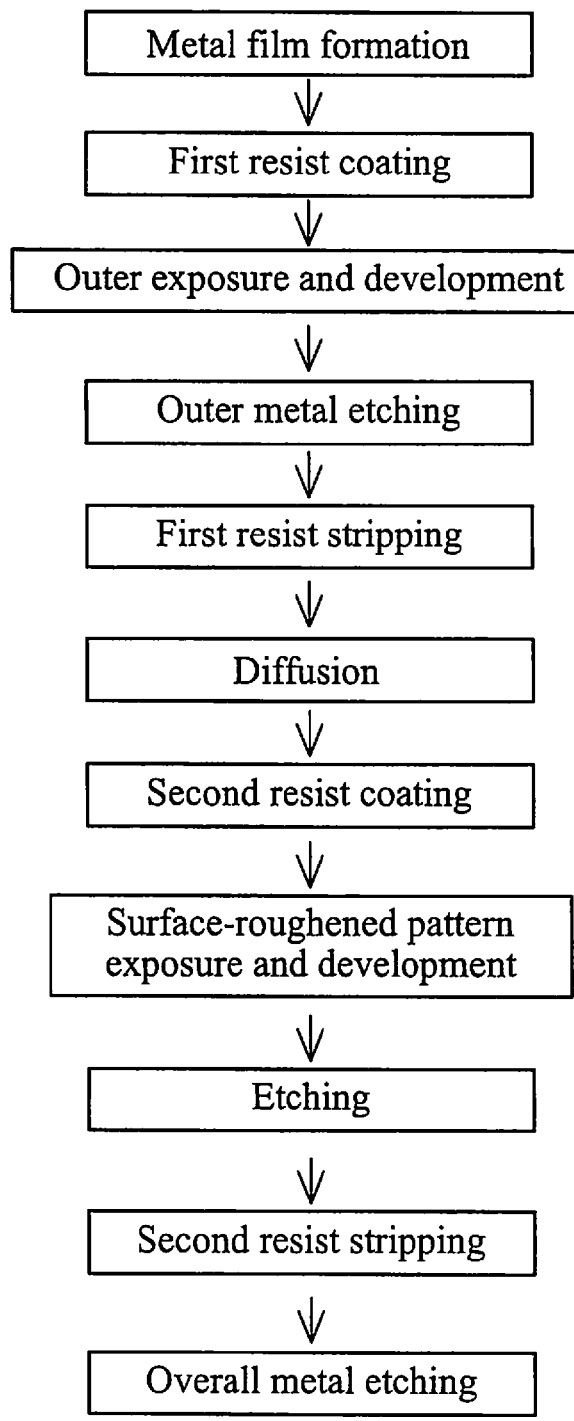
FIG. 3 is a flowchart showing surface roughening according to Embodiment 1 of the present invention.

Next is a description of surface roughening of the joining regions of the lower lid member 3 and the upper lid member 4 described above with reference to FIGS. 3 to 11. FIG. 3 is a flowchart showing a surface roughening process.

Figure 4:
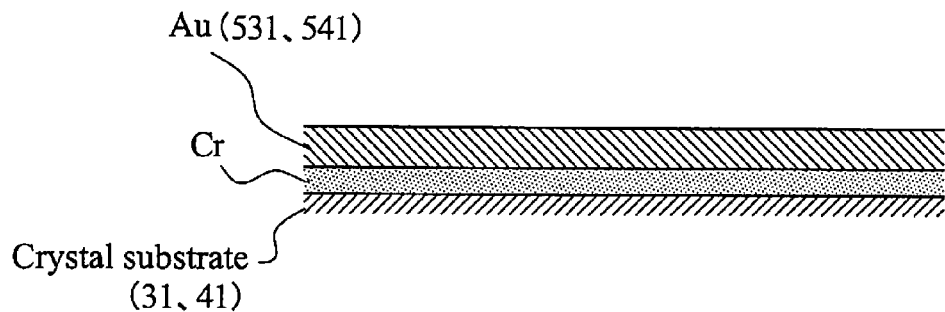
FIG. 4 is a schematic diagram showing surface roughening according to Embodiment 1 of the present invention.
Figure 5:
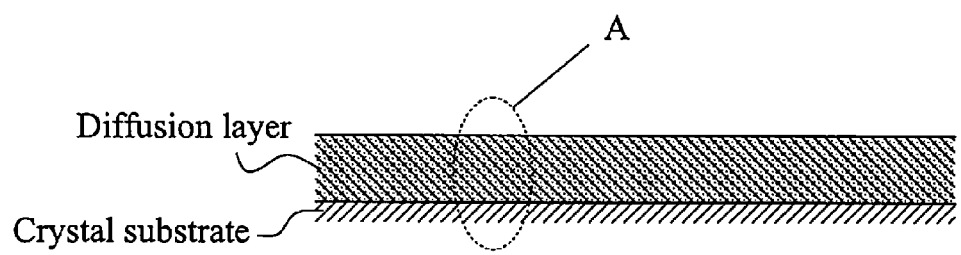
FIG. 5 is a schematic diagram showing surface roughening according to Embodiment 1 of the present invention.

First, as shown in FIG. 4, a metal film (Cr layer and Au layer) including two types of metals (Cr and Au) is laminated and formed using vapor deposition techniques on the joining surface sides (one main surfaces 31 and 41) of the lower lid member 3 and the upper lid member 4 on which the crystal resonator plate 2 is joined (metal film formation step in FIG. 3). Note that in Embodiment 1, although the metal film formed by vapor deposition is constituted by two types of metals, the number of the types of metals is not limited to two, and a metal film may be configured of two or more types of metals.

Next, a resist is applied onto the metal film by spin coating (first resist application step in FIG. 3) and exposed to light so as to form a resist pattern having a predetermined outer shape. Then, part of the metal film is exposed by development (outer exposure and development step in FIG. 3). The exposed metal film is dissolved by metal etching so that the crystal substrates of the lower lid member 3 and the upper lid member 4 are exposed (outer metal etching step in FIG. 3). Thereafter, the remaining resist is stripped off, using a stripping solution (first resist stripping step in FIG. 3).

Then, heat processing is performed on the metal film (Cr and Au) which has been formed in a predetermined pattern. Performing heat processing in this way promotes metal diffusion inside the metal film (diffusion step in FIG. 3). Here, the thickness of the Cr layers formed on the substrates of the lower lid member 3 and the upper lid member 4 are much thinner than that of the Au layers, and a diffusion layer is formed by diffusing Cr inside or on the surface of the Au layers by controlling the heating temperature and the heating time (see FIG. 5). Here, the inventors assume that the diffusion of Cr into the AU layer in the diffusion step produces a plurality of "conducting paths" for Cr inside the diffusion layer, each conducting path being constituted by Cr atoms continuously connected along the thickness of the diffusion layer (see the connection of Cr in FIG. 6). Note that the thickness of the layer of the metal film (Cr layer and Au layer) constituted by two types of metals (Cr and Au) shown in FIG. 4 is not intended to be limited to the one shown in FIG. 4 and may be an arbitrary thickness. For example, the amount of Cr to be diffused by heat processing may be controlled by increasing or reducing the thickness of Cr as a base metal relative to the thickness of Au, which enables control of the formation of micropores by an etchant penetrating into the Cr layer after the diffusion step. That is, roughened surface conditions can be controlled.

Figure 7:
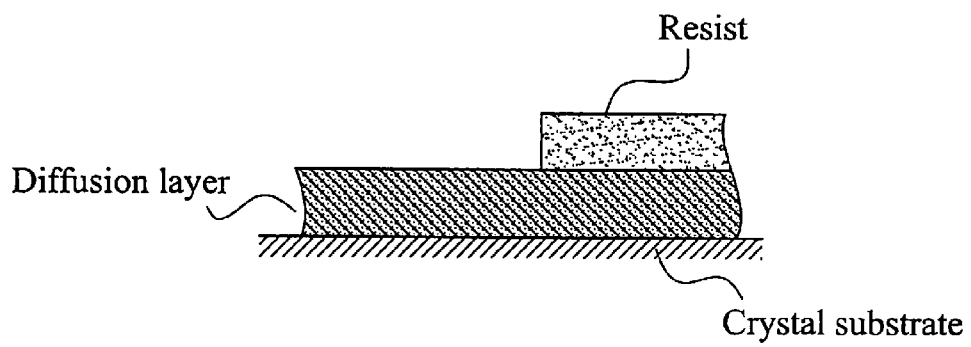
FIG. 7 is a schematic diagram showing surface roughening according to Embodiment 1 of the present invention.

Next, a resist is applied again to the diffusion layer (second resist application step in FIG. 3). Then, as shown in FIG. 7, the resist on a region whose surface is to be roughened is removed by exposure and development (roughened-surface pattern exposure and development step in FIG. 3).

Figure 6:
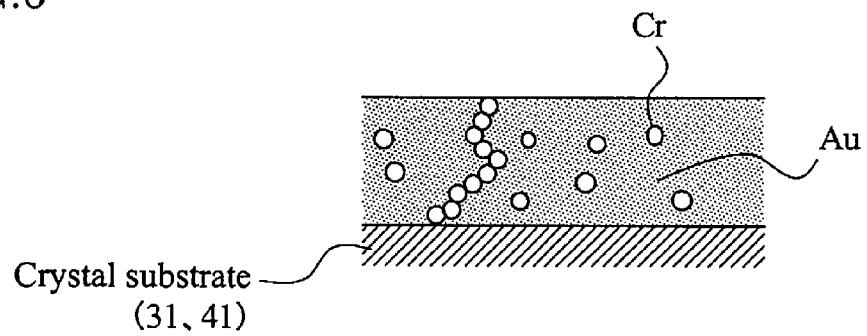
FIG. 6 is a schematic diagram showing surface roughening according to Embodiment 1 of the present invention.
Figure 8:
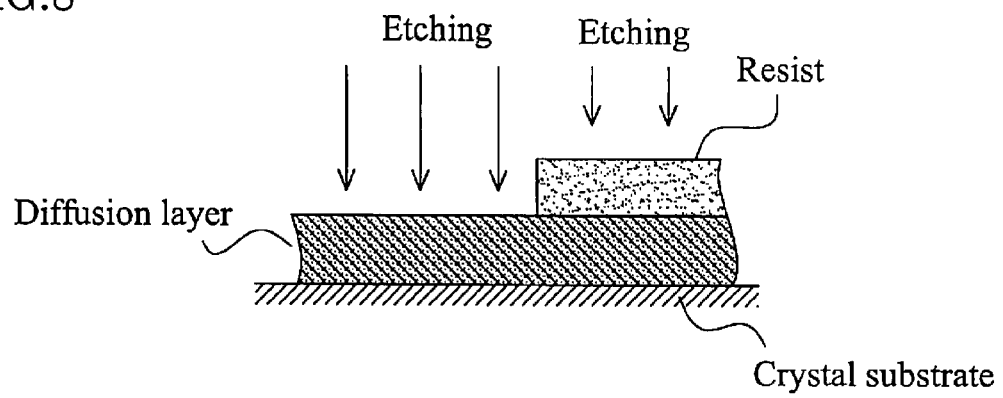
FIG. 8 is a schematic diagram showing surface roughening according to Embodiment 1 of the present invention.
Figure 9:
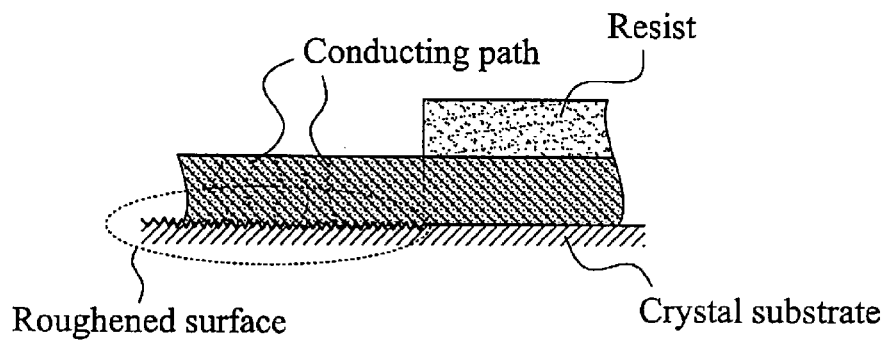
FIG. 9 is a schematic diagram showing surface roughening according to Embodiment 1 of the present invention.

Then, as shown FIG. 8, in a state in which a resist remaining region and a resist-removed region coexist on the metal film (diffusion layer), the metal film is charged into an etchant (in Embodiment 1, a solution of ammonium fluoride) and subjected to wet etching (etching step in FIG. 3). At this time, the etchant penetrates into the region of the metal film that is not covered with the resist, reaches the substrate of crystal under the metal film (diffusion layer), and causes corrosion of the substrate surface of crystal. This is considered due to the presence of a plurality of "conducting paths" for Cr formed in the metal film in the diffusion step as shown in FIG. 6. It is conceived that, since Cr is corrosive to the etchant and Au is corrosion resistant to the etchant, the etchant penetrates into the metal film through the "conducting paths" and accordingly a large number of micropores (pin holes) are formed in the surface of the crystal substrate surface (see FIG. 9). In this way, the substrate surface of crystal under the metal film (diffusion layer) can be roughened through the metal film. Meanwhile, a portion of the crystal substrate that is covered with the resist under the metal film is left without corrosion by the etchant, because the resist is made of a material that is highly corrosion resistant to the etchant.

Figure 10:
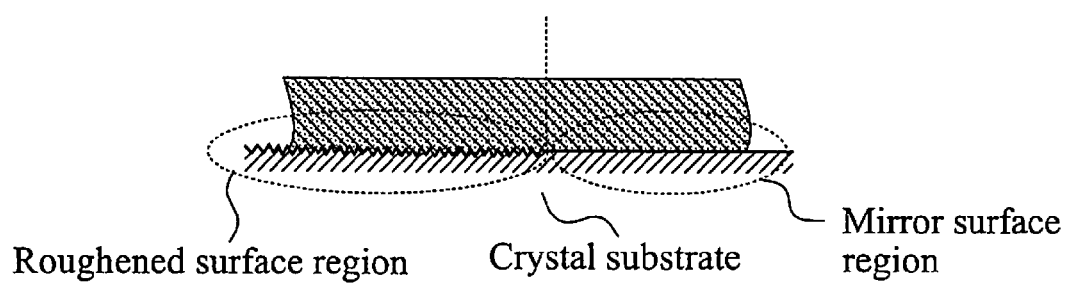
FIG. 10 is a schematic diagram showing surface roughening according to Embodiment 1 of the present invention.
Figure 11:
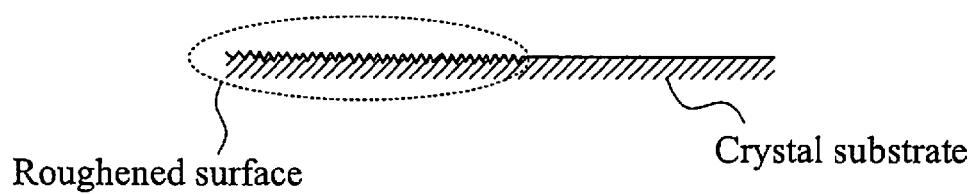
FIG. 11 is a schematic diagram showing surface roughening according to Embodiment 1 of the present invention.

After surface roughening has been performed as described above, the resist is stripped off using a stripping solution as shown in FIG. 10 (second resist removal step in FIG. 3). Then, the metal film that remains on the crystal substrate is removed by metal etching (overall metal etching step in FIG. 3). This metal etching causes the crystal substrate in the roughened-surface region and the crystal substrate in the mirror surface region to be exposed (see FIG. 11).

The above has been a description of surface roughening of the joining regions of the lower lid member 3, the upper lid member 4, and the crystal resonator plate 2. Next is a description of a manufacturing method for the crystal resonator 1 using the lower lid member 3 and the upper lid member 4 that have been subjected to surface roughening as described above.

In Embodiment 1, with a wafer on which a large number of lower lid members 3 are formed collectively, an individual crystal resonator plate 2 is disposed on each of the lower lid members 3, an individual upper lid member 4 is disposed on each of the crystal resonator plates 2, and thereafter the wafer is diced into a large number of individual crystal resonators 1. A description is given of the manufacturing method for such crystal resonators 1. Note that the present invention is not intended to be limited to the forms of members described in Embodiment 1, and a method is possible in which, using a wafer on which large numbers of all of the constituent members of the package 11, namely lower lid members 3, crystal resonator plates 2, and upper lid members 4, are formed collectively, the crystal resonator plates 2 are disposed on the lower lid members 3, the upper lid members 4 are disposed on the crystal resonator plates 2, and thereafter the wafer is diced into individual crystal resonators 1. This case is suitable for the mass production of crystal resonators 1.

First, a wafer on which a large number of lower lid members 3 are formed collectively is disposed with one main surfaces 31 of the lower lid members 3 facing upward. Then, individual crystal resonator plates 2 are disposed at positions determined by image recognition means on the one main surfaces 31 of the lower lid members 3 on the wafer so that the one main surfaces 21 of the crystal resonator plates 2 face the one main surfaces 31 of the lower lid members 3. At this time, the crystal resonator plates 2 are disposed such that the locations of the third joining material 53 formed on the joining surfaces 32 of the lower lid members 3 substantially match the locations of the first joining material 51 formed on the one main surfaces 201 of the frame portions 28 of the crystal resonator plates in plan view. The crystal resonator plates 2 are also disposed such that the locations of the second joining electrodes 33 formed on the one main surface 31 of the lower lid members 3 substantially match the locations of the Au-plated layers 50 formed on the first joining electrodes 25 of the crystal resonator plates 2 in plan view.

After the crystal resonator plates 2 have been disposed on the lower lid members 3, individual upper lid members 4 are disposed at positions determined by the image recognition means on the other main surfaces 202 of the frame portions 28 of the crystal resonator plates 2 so that the one main surfaces 41 of the upper lid members face the other main surfaces 22 of the crystal resonator plates. At this time, the upper lid members 4 are disposed such that the locations of the second joining material 52 formed on the other main surfaces 202 of the frame portions 28 of the crystal resonator plates 2 substantially match the locations of the fourth joining material 54 formed on the joining surfaces 42 of the upper lid members 4 in plan view.

After having been laminated one above another, the lower lid members 3, the crystal resonator plates 2, and the upper lid members 4 are temporarily joined to one another, using ultrasonic waves. After the temporary joining of the lower lid members 3, the crystal resonator plates 2, and the upper lid members 4, other manufacturing processes (such as degassing of the internal spaces 12 and adjustment for the oscillation frequency) are performed, and thereafter the lower lid members 3, the crystal resonator plates 2, and the upper lid members 4 are permanently joined to one another by heating and melting (discussed later).

The lower lid members 3, the crystal resonator plates 2, and the upper lid members 4 that have been joined temporarily are placed in an environment in which the temperature is increased to a predetermined temperature, and are permanently joined to one another by melting the joining material (the first joining material 51, the second joining material 52, the third joining material 53, and the fourth joining material 54) formed on the members (the lower lid members 3, the crystal resonator plates 2, and the upper lid members 4). More specifically, the first joining material 51 and the third joining material 53 are joined to form the joining material 5, by which the crystal resonator plates 2 and the lower lid members 3 are joined to each other. Such joining of the crystal resonator plates 2 and the lower lid members 3 by the joining material 5 enables the excitation electrodes 23 formed on the one main surfaces 21 of the crystal resonator plates 2 to be hermetically sealed as shown in FIG. 1. Simultaneously with the joining of the first joining material 51 and the third joining material 53, the second joining material 52 and the fourth joining material 54 are joined by heating and melting to form the joining material 5, by which the crystal resonator plates 2 and the upper lid members 4 are joined to each other. Such joining of the crystal resonator plates 2 and the upper lid members 4 by the joining material 5 enables the excitation electrodes 23 formed on the other main surfaces 22 of the crystal resonator plates 2 to be hermetically sealed as shown in FIG. 1. Note that in Embodiment 1, although the lower lid members 3, the crystal resonator plates 2, and the upper lid members 4 are temporarily and permanently joined to one another under a vacuum atmosphere, the present invention is not intended to be limited thereto, and they may be joined under an atmosphere of an inert gas such as nitrogen.

According to the crystal resonator 1 described in Embodiment 1, the substrates of the joining regions of the constituent members (the lower lid member 3 and the upper lid member 4) of the crystal resonator 1 have roughened surfaces, and micro-unevenness formed by such surface roughening on the substrate surfaces of the joining regions of the lower lid member 3 and the upper lid member 4 functions as "wedges"

to act against horizontal stress. In other words, a so-called anchor effect is produced and improves the joining strength between the joining material 5 and the roughed substrate surfaces of the joining regions of the lower lid member 3 and the upper lid member 4.

In addition, the method for etching the constituent members of the crystal resonator 1 according to Embodiment 1 includes the metal film formation step, the diffusion step, and the etching step. Thus, part of at least one main surfaces of the constituent members whose surface conditions are like mirror-finished surfaces having very little unevenness can be roughened. More specifically, regions not to be roughened are covered and thereby protected with a resin or the like, whereas a large number of micropores are formed in the substrate surfaces of regions to be roughened by not forming a protective film such as a resist and thereby causing an etchant to penetrate into the substrates of the constituent members through the metal film (diffusion layer) where metal diffusion has occurred.

That is, the manufacturing method for the crystal resonator 1 described in Embodiment 1 that includes the metal film formation step, the diffusion step, and the etching step enables surface roughening of part of the one main surfaces 31 and 41 of the lower lid member 3 and the upper lid member 4 whose surface conditions are like mirror-finished surfaces having very little unevenness. More specifically, regions not to be roughened are covered and thereby protected with a resin or the like, whereas a number of micropores are formed in the surfaces of regions to be roughened by not forming a protective film such as a resist and thereby causing an etchant to penetrate into the substrates of the lower lid member 3 and the upper lid member 4 through the metal film (diffusion layer) where metal diffusion has occurred. This enables selective surface roughening.

Moreover, according to Embodiment 1, the manufacturing cost of the crystal resonator 1 can be reduced because interatomic bonding that was required regarding joining in the conventional technology is not an absolute necessity.

The upper lid member 4 and the lower lid member 3 are made of crystal, and the crystal resonator plate 2 is made of crystal. The metal film formation step involves forming a two-layer configuration of a Cr layer and an Au layer by forming the Cr layer on the substrates of the upper lid member 4 and the lower lid member 3 and laminating the Au layer on the Cr layer so as to form a metal film. The diffusion step involves roughening the substrates of the upper lid member 4 and the lower lid member 3 by diffusing Cr in the Cr layer into Au in the Au layer, performing wet etching using an etchant that is corrosive to Cr and crystal, and thereby forming a large number of micropores in the substrate surfaces of the upper lid member 4 and the lower lid member 3. This facilitates outer formation by wet etching. In addition, the use of crystal for the upper lid member 4 and the lid member 3 provides favorable adhesion to the crystal resonator plate 2 made of crystal. Moreover, the use of Au that is corrosion resistant to the etchant enables the etchant to penetrate into the substrates of the upper lid member 4 and the lid member 3 without causing corrosion of the metal film, even if wet etching is performed through the metal film in which Cr is diffused. This produces a large number of micropores in the substrate surfaces of the upper lid member 4 and the lid member 3 under the metal film where metal diffusion has occurred and roughens the substrate surfaces.

In the configuration described in Embodiment 1, the resonating portion 20 has an inverted mesa shape with the rim portion 26 formed along the outer periphery of the resonating portion 20, and the thin-walled portion 27 is formed outside the resonating portion 20. However, the present invention is not intended to be limited to such an inverted mesa-shaped configuration. For example, a configuration is possible in which a flat plate partly formed with through holes is provided inside a frame portion, without forming a thin-walled portion.

Note that in Embodiment 1, although Cr, Au, and Sn are used as the joining material 5, the present invention is not intended to be limited thereto, and the joining material 5 may be configured of Cr, Au, and Ge, for example. Alternatively, a plated laminated film made of Au and Sn, for example, or a plated alloy layer made of Au and Sn, for example, may be formed on the crystal resonator plate 1 side, and an Au-plated layer (a plated layer made of a single type of metallic element) may be formed on the lower lid member 3 side and the upper lid member 4 side. Moreover, in Embodiment 1, although crystal is used as a material for two package bases, materials other than crystal, such as glass or sapphire, may be used.

Modification of Embodiment 1

Figure 12:
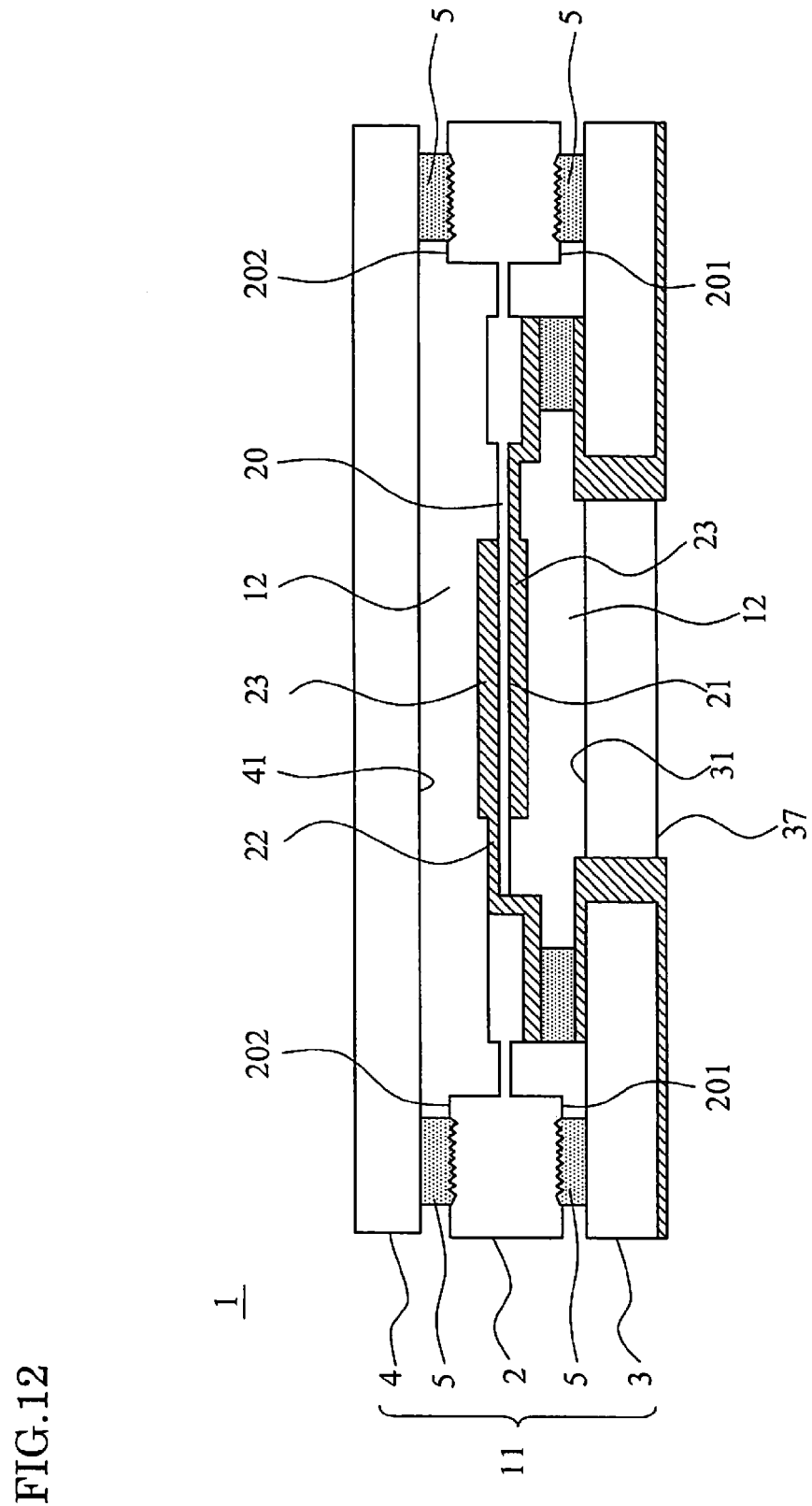
FIG. 12 is a schematic cross-sectional view of a crystal resonator taken along the long side thereof according to a modification of Embodiment 1 of the present invention.

A modification of Embodiment 1 according to the present invention is shown in FIG. 12. The modification of FIG. 12 is an example in which a target for surface roughening is a joining region of the crystal resonator plate 2, instead of the joining regions of the lower lid member 3 and the upper lid member 4. Even with such a configuration, it is possible to improve the joining strength between the crystal resonator plate 2 and the joining material 5. Note that, in such a configuration, the surfaces of joining regions to be roughened may be both of the main surface entirelys 201 and 202 of the frame portion 28. That is, not only the region of the frame portion 28 where the metal film (joining material 5) is formed but also a region thereof outside that region are subjected to surface roughening, which prevents fluid metals produced by heating and melting from flowing in a direction toward the resonating portion 20. Such surface roughening of both of the main surface entirelys 201 and 202 of the frame portion 28 allows the roughened surfaces to function as resistance acting against the movement of the melted metal film (joining material 5) and thereby prevents melted metals from flowing toward the resonating portion 20.

Figure 13:
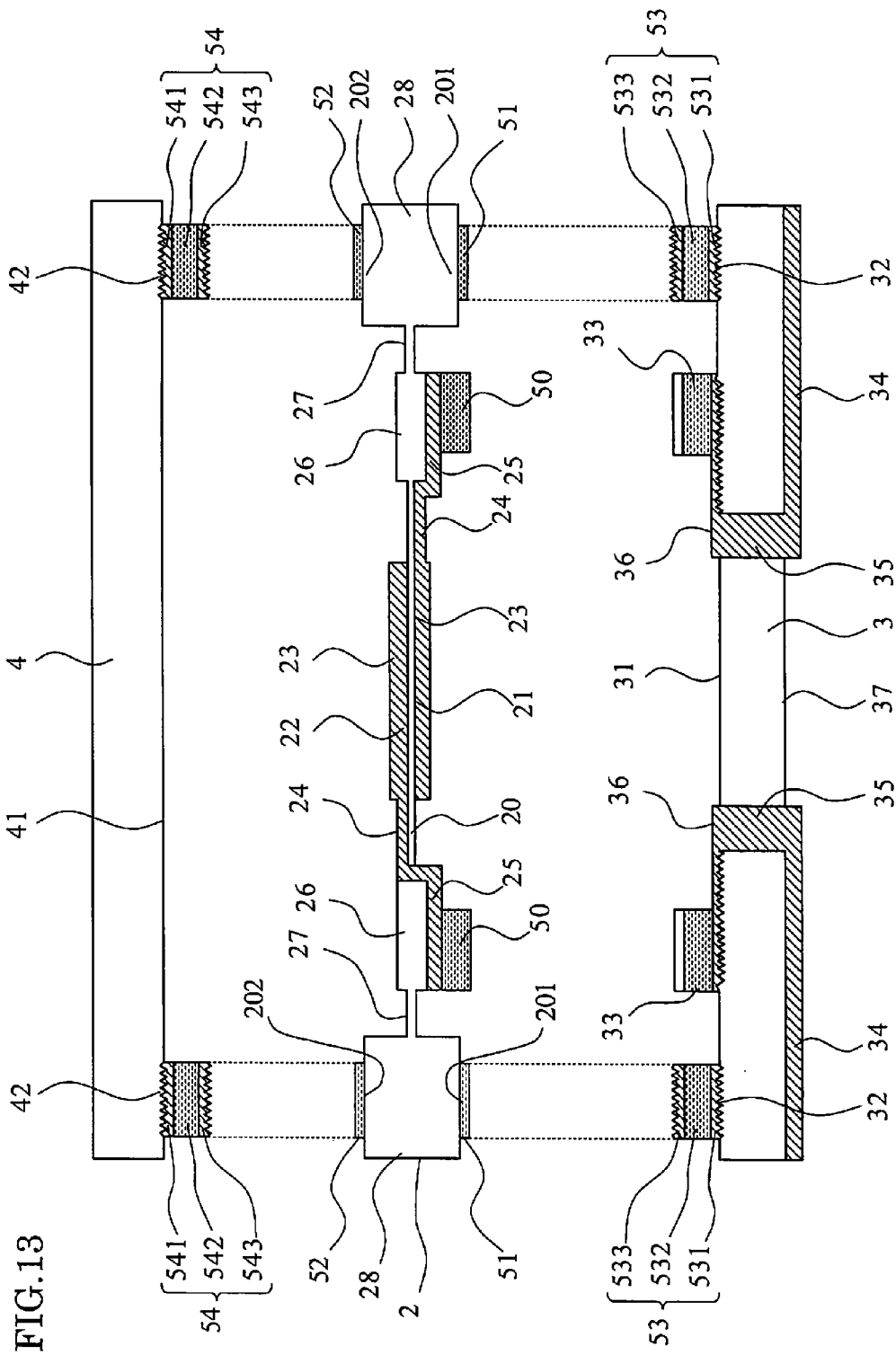
FIG. 13 is a schematic configuration diagram showing constituent members of the crystal resonator according to the modification of Embodiment 1 of the present invention.

In Embodiment 1, although the joining regions of the lower lid member 3 and the upper lid member 4 are subjected to surface roughening, the present invention is not intended to be limited thereto. For example, the surfaces of the third joining material 53 and the fourth joining material 54 formed on the surface-roughened substrates of the joining regions of the lower lid member 3 and the upper lid member 4 may be roughened as shown in FIG. 13. In this case, the joining regions of the lower lid member 3 and the upper lid member 4 as well as the third joining material 53 and the fourth joining material 54 have roughened surfaces. Thus, for example when a plated layer is further formed by electrolytic plating on the third joining material 53 and the fourth joining material 54 formed on the surface-roughened substrates of the joining regions of the lower lid member 3 and the upper lid member 4, an anchor effect is produced between the plated layer and the roughened surfaces of the third joining material 53 and the fourth joining material 54 and improves mechanical strength at the time of temporarily joining the upper lid member 4, the lower lid member 3, and the crystal resonator plate 2 using ultrasonic waves.

In Embodiment 1, although the joining regions of the lower lid member 3 and the upper lid member 4 are subjected to surface roughening through the manufacturing steps shown in FIGS. 3 to 11, the present invention is not intended to be limited thereto. For example, the surfaces of the joining regions of the lower lid member 3 and the upper lid member 4 may be roughened using manufacturing methods as shown in FIGS. 14 to 17.

The following is a description of other methods for roughening the surfaces of the lower lid member 3, the upper lid member 4, and the crystal resonator plate 2.

Figure 14:
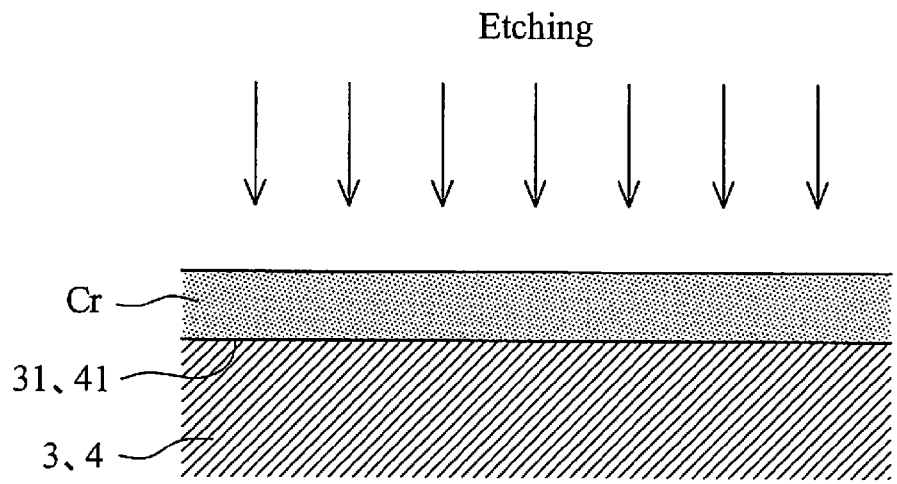
FIG. 14 is a schematic diagram showing surface roughening according to Embodiment 1 of the present invention.
Figure 15:
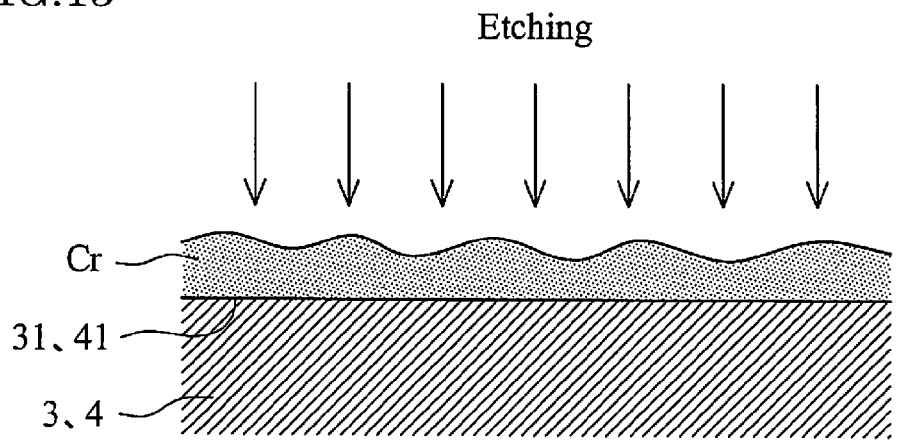
FIG. 15 is a schematic diagram showing surface roughening according to Embodiment 1 of the present invention.
Figure 16:
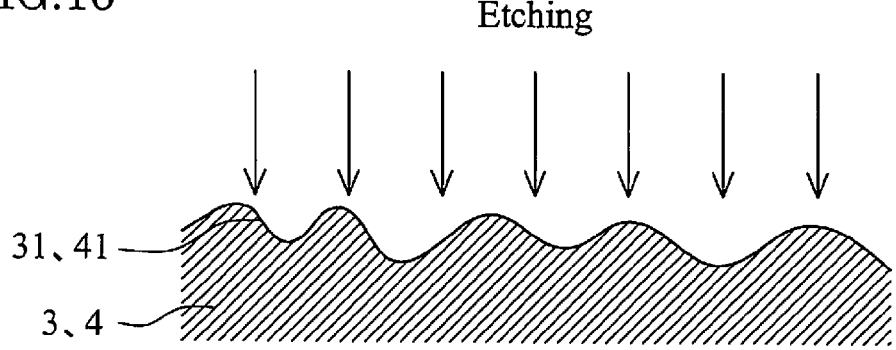
FIG. 16 is a schematic diagram showing surface roughening according to Embodiment 1 of the present invention.

In the manufacturing process shown in FIGS. 14 to 16, a Cr layer is formed by vapor deposition on the one main surfaces 31 and 41 of the crystal substrates of the lower lid member 3 and the upper lid member 4, and the wafer is charged into an etchant (a solution of ammonium fluoride) and subjected to wet etching (see FIG. 14). At this time, the etching roughens the surface of the Cr layer, and the degree of surface roughening increases in proportion to the duration of wet etching (see FIG. 15). Continuously performing wet etching produces unevenness on the one main surfaces 31 and 41 of the crystal substrates of the lower lid member 3 and the upper lid member 4 and accordingly roughens the one main surfaces 31 and 41 of the crystal substrates of the lower lid member 3 and the upper lid member 4, as shown in FIG. 16.

Figure 17:
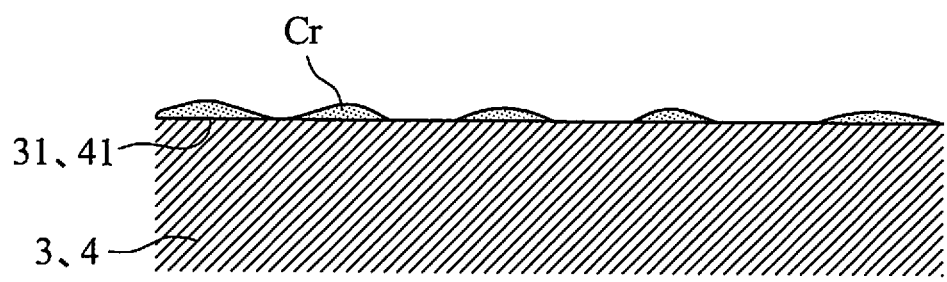
FIG. 17 is a schematic diagram showing surface roughening according to Embodiment 1 of the present invention.

In the manufacturing method shown in FIG. 17, a Cr layer is formed by vapor deposition in scattered locations on the one main surfaces 31 and 41 of the crystal substrates of the lower lid member 3 and the upper lid member 4. The lower lid member 3 and the upper lid member 4 shown in FIG. 17 are then charged into an etchant (a solution of ammonium fluoride) and subjected to wet etching. Continuously performing wet etching produces unevenness on the one main surfaces 31 and 41 of the crystal substrates of the lower lid member 3 and the upper lid member 4 and accordingly roughens the one main surfaces 31 and 41 of the crystal substrates of the lower lid member 3 and the upper lid member 4, as shown in FIG. 16.

Alternatively, vapor deposition techniques and photolithographic techniques may be used for the manufacture of the lower lid member 3, the upper lid member 4, and the crystal resonator plate 2 as described above, and a step of forming a large number of small holes at random locations in the Cr layer may further be added to the process. In this case, etching may be performed using, as a mask, a Cr layer in which a large number of small holes are formed at random locations, which enables a large number of small holes to be formed in the lower lid member 3, the upper lid member 4, and the crystal resonator plate 2.

Embodiment 2

Figure 18:
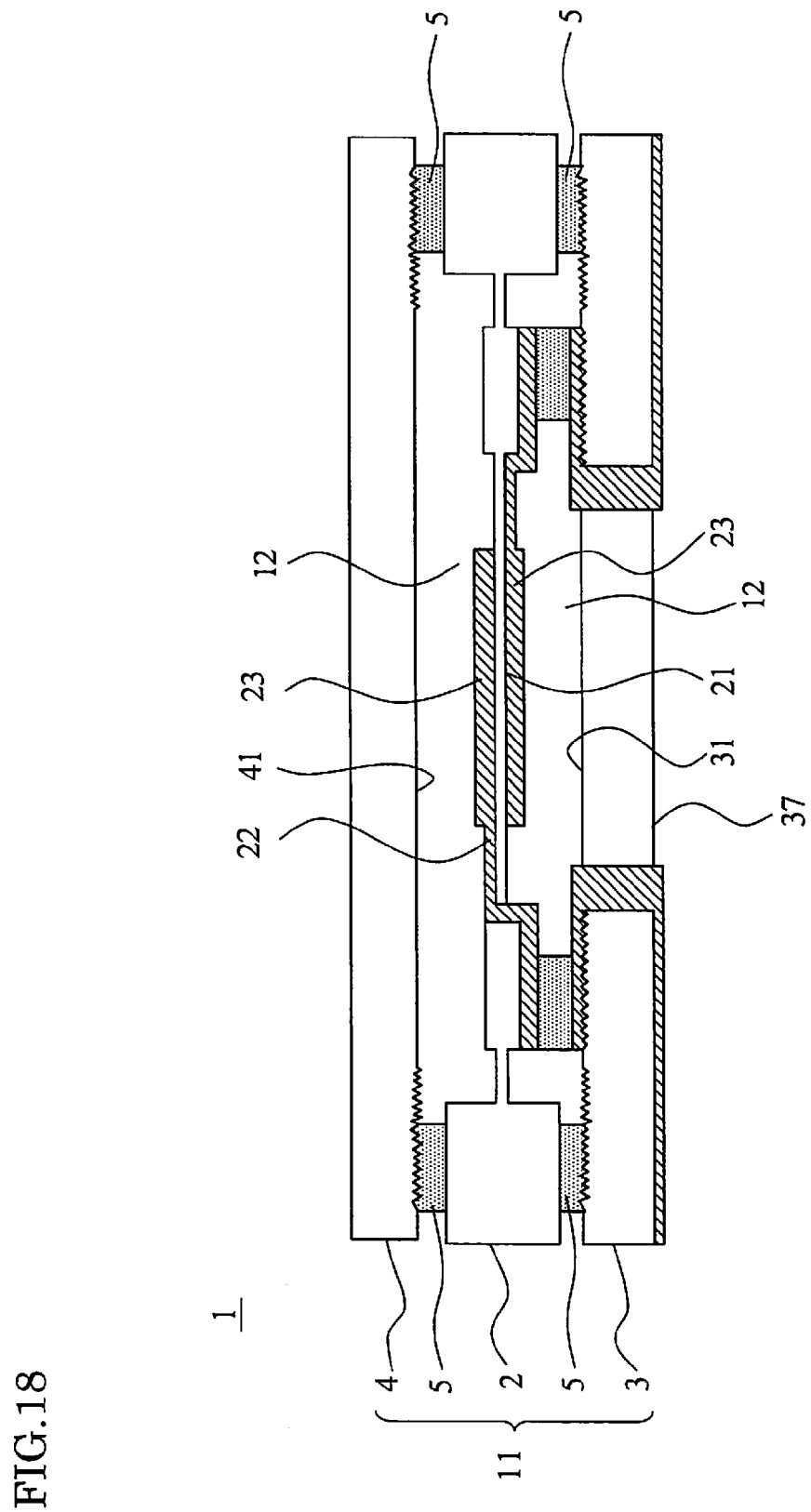
FIG. 18 is a schematic cross-sectional diagram of a crystal resonator taken along the long side thereof according to Embodiment 2 of the present invention.

Embodiment 2 according to the present invention will be described with reference to FIG. 18, taking the example of a crystal resonator using a piezoelectric resonator plate as in Embodiment 1 described above. FIG. 18 is a cross-sectional view of a crystal resonator 1 taken along the long side of a crystal resonator plate 2 according to Embodiment 2. Note that, in Embodiment 2, the same reference numerals have been given to constituent members that are the same as in Embodiment 1, and parts of descriptions thereof have been omitted. Also, parts of the configuration of Embodiment 2 that are the same as those of Embodiment 1 have similar effects to those of Embodiment 1. Accordingly, the following description of Embodiment 2 focuses on differences from Embodiment 1.

As shown in FIG. 18, both joining regions of the upper lid member 4 and the lower lid member 3 have roughened surfaces in Embodiment 2. Both of the joining regions of the upper lid member 4 and the lower lid member 3 are formed wider than the joining region of the crystal resonator plate 2, inwardly of the planar direction of their one main surfaces 31 and 41 in plan view.

With such a configuration, for example when the lower lid member 3, the upper lid member 4, and the crystal resonator plate 5 are joined to one another by heating and melting the metal film constituting the joining material 5 (the first joining material 51, the second joining material 52, the third joining material 53, and the fourth joining material 54), the fluid joining material 5 is prevented from moving inwardly of the crystal resonator 1. More specifically, a fillet of the joining material 5 is more easily formed toward the joining regions (surface-roughened region) of the lower lid member 3 and the upper lid member 4 that are formed wider inwardly. This fillet provides stronger joining of the lower lid member 3, the upper lid member 4, and the crystal resonator plate 2. That is, controlling the surface-roughened regions of the lower lid member 3 and the upper lid member 4 enables control of a forming region of the joining material 5 where the fillet is to be formed.

Embodiment 3

Figure 19:
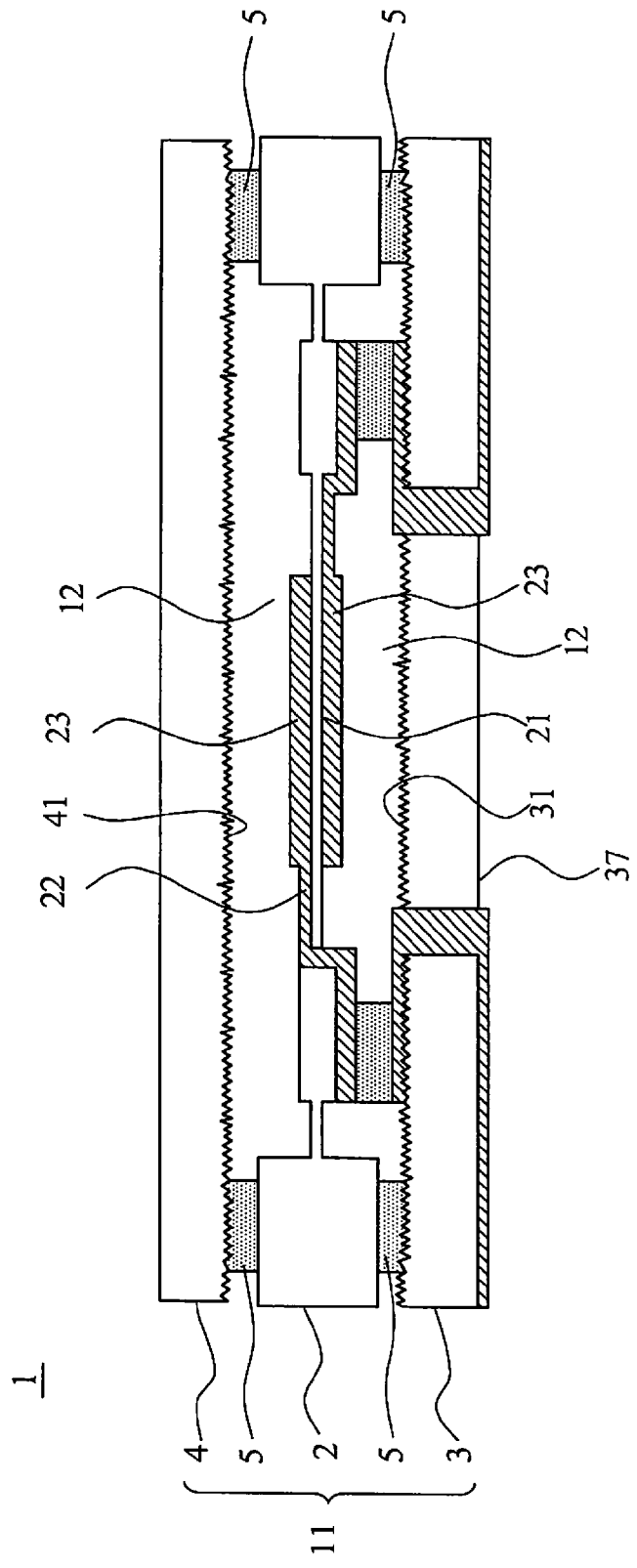
FIG. 19 is a schematic cross-sectional diagram of a crystal resonator taken along the long side thereof according to Embodiment 3 of the present invention.

Embodiment 3 according to the present invention will be described with reference to FIG. 19, taking the example of a crystal resonator using a crystal resonator plate as a piezoelectric resonator plate as in Embodiment 1 described above. FIG. 19 is a cross-sectional view of a crystal resonator 1 taken along the long side of a crystal resonator plate 2 according to Embodiment 3. Note that, in Embodiment 3, the same reference numerals have been given to constituent members that are the same as in Embodiment 1, and parts of descriptions thereof have been omitted. Also, parts of the configuration of Embodiment 3 that are the same as those of Embodiment 1 have similar effects to those of Embodiment 1. Accordingly, the following description of Embodiment 3 focuses on differences from Embodiment 1.

In the crystal resonator 1 according to Embodiment 3, the entire one main surfaces 31 and 41 of the lower lid member 3 and the upper lid member 4 where the crystal resonator plate 2 is joined are roughened as shown in FIG. 19.

With such a configuration in which the entire one main surface 31 of the lower lid member 3 is roughened, for example when an electrode pattern that is electrically connected to an external connection terminal connected to external devices is formed on the one main surface 31 of the lower lid member 3, the entirely roughened one main surface 31 improves the adhesion of the electrode pattern to the one main surface 31. In addition, this simplifies the surface roughening process and improves productivity as compared with the case of selectively performing surface roughening on only a region where the electrode pattern is formed.

Figure 20:
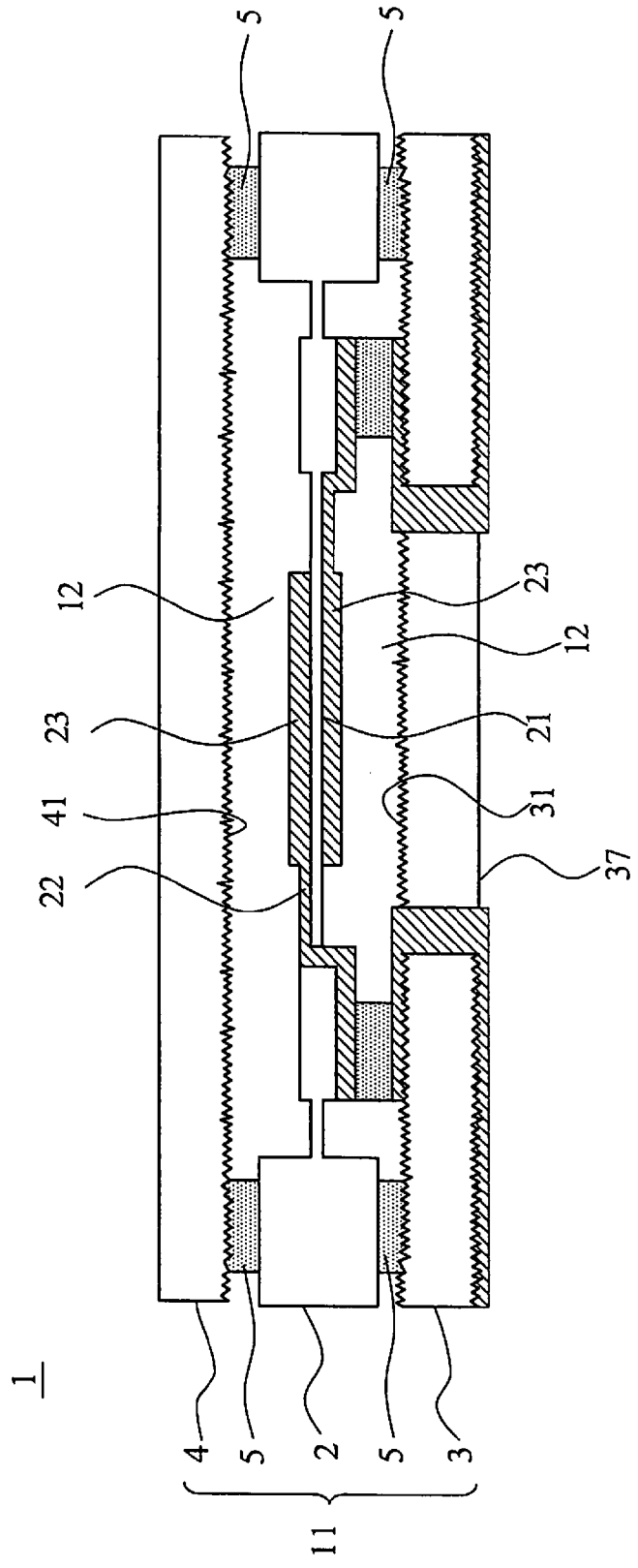
FIG. 20 is a schematic cross-sectional diagram of a crystal resonator taken along the long side thereof according to a modification of Embodiment 3 of the present invention.

In Embodiment 3, although the substrates of the entire one main surfaces 31 and 41 of the lower lid member 3 and the upper lid member 4 are subjected to surface roughening, the present invention is not intended to be limited thereto, and the entire other main surface 37 of the lower lid member 3 may be subjected to surface roughening. As another alternative, the substrate surfaces of regions where an external connection terminal and an electrode pattern are formed may be roughened as shown in FIG. 20. That is, the above-described effects can be achieved as long as the substrates of at least main surface regions where terminals, such as external connection terminals, and electrode patterns are formed have roughened surfaces. Such surface roughening performed on the substrate of the joining region of the lower lid member 3 where external connection terminals are formed is also applicable to Embodiments 1 and 2 described above and Embodiments 4 and 5 described below.

Embodiment 4

Figure 21:
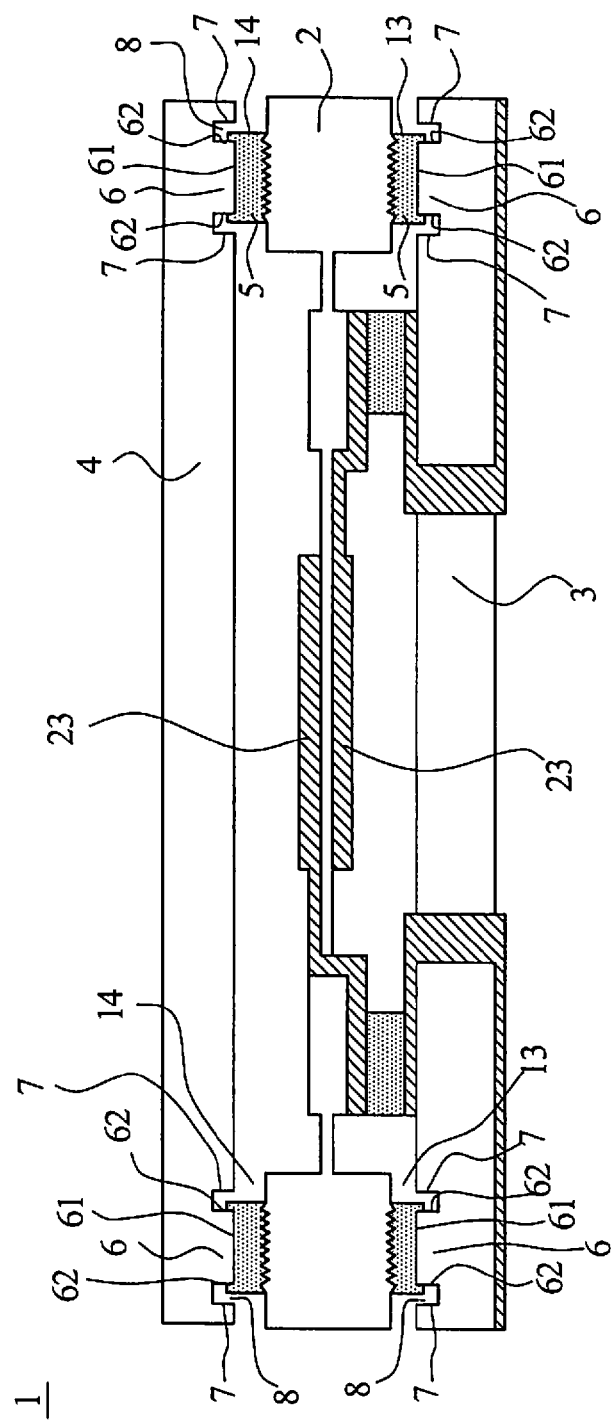
FIG. 21 is a schematic cross-sectional diagram of a crystal resonator taken along the long side thereof according to Embodiment 4 of the present invention.

Embodiment 4 according to the present invention will be described with reference to FIG. 21, taking the example of a crystal resonator using a crystal resonator plate as a piezoelectric resonator plate as in Embodiment 1 described above. FIG. 21 is a cross-sectional view of a crystal resonator 1 taken along the long side of a crystal resonator plate 2 according to Embodiment 4. Note that, in Embodiment 4, the same reference numerals have been given to constituent members that are the same as in Embodiment 1, and parts of descriptions thereof have been omitted. Also, parts of the configuration of Embodiment 4 that are the same as those of Embodiment 1 have similar effects to those of Embodiment 1. Accordingly, the following description of Embodiment 4 focuses on differences from Embodiment 1.

In the crystal resonator 1 shown in FIG. 21, joining regions of both main surfaces 201 and 202 of the frame portion 28 of the crystal resonator plate 2 have roughened surfaces. The roughened surfaces of the joining regions of the crystal resonator plate 2 are formed through the surface roughening process as described above in Embodiment 1. Such surface roughening produces an anchor effect between the joining material 5 and the frame portion 28 and accordingly improves the joining strength between the crystal resonator plate 2, and the lower lid member 3 and the upper lid member 4.

In addition, a multi-surface joining portion for joining the joining material 5 to a plurality of surfaces having different planar directions is provided in the joining region of the lower lid member 3 and its vicinity at a joining site 13 between the lower lid member 3 and the crystal resonator plate 2. Also, an enlargement preventing portion for preventing a joining region to be joined to the joining material 5 from being enlarged is provided outside the multi-surface joining portion.

Moreover, a multi-surface joining portion for joining the joining material 5 to a plurality of surfaces having different planar directions is provided in the joining region of the upper lid member 4 and its vicinity at a joining site 14 between the upper lid member 4 and the crystal resonator plate 2. Also, an enlargement preventing portion for preventing a joining region to be joined to the joining material 5 from being enlarged is provided outside the multi-surface joining portion.

The multi-surface joining portions and the enlargement preventing portions are configured by forming two grooves 8 aligned along the outer periphery of the one main surfaces 31 and 41 of the lower lid member 3 and the upper lid member 4. More specifically, forming the two grooves 8 produces a protrusion 6 therebetween that serves as the multi-surface joining portion, and recesses 7 formed continuous to the protrusion 6 outside the protrusion 6 serve as the enlargement preventing portions. The protrusion 6 has an end face 61 and a side face 62, and the joining material 5 is joined to the protrusion 6. The recesses 7 are formed outside the protrusion 6 in the planar direction of the one main surfaces 31 and 41 in plan view.

As described above, in the crystal resonator 1 according to Embodiment 4, the provision of the multi-surface joining portions and the enlargement preventing portions in the lower lid member 3 and the upper lid member 4 prevents the joining material 5 from spreading in the main surface direction (planar direction) on the joining surfaces (one main surfaces 31 and 41) of the lower lid member 3 and the upper lid member 4, when the lower lid member 3 and the upper lid member 4 are joined via the joining material 5 with the crystal resonator plate 2 in between.

More specifically, in the crystal resonator 1 according to Embodiment 4, the provision of the multi-surface joining portion in the lower lid member 3 and the upper lid member 4 enables the joining material 5 to be joined to a plurality of surfaces having different planar directions (specifically, the end face 61 and both of the side faces 62 of the protrusion 6), thus producing an anchor effect and accordingly increasing the strength of joining to the joining material 5. Also, the protrusion 6 having a plurality of surfaces forms the multi-surface joining portion, and the joining material 5 is joined to a plurality of surfaces including the end face 61 of the protrusion 6. Accordingly, an anchor effect is readily produced since the joining material 5 can be joined to a plurality of continuous surfaces having different planar directions.

The spread of the joining material 5 (wetting) at the joining sites 13 and 14 (joining regions) is a natural phenomenon occurring in heat-melt joining of the joining material 5. However, in the crystal resonator 1 according to Embodiment 4, the provision of the multi-surface joining portions in the joining regions of the lower lid member 3 and the upper lid member 4 and the vicinity thereof and the provision of the enlargement preventing portions outside the multi-surface joining portions prevent the joining material 5 from flowing to (wetting) the end face of the crystal resonator 1 and from penetrating into the internal spaces 12 of the crystal resonator 1, even if the joining material 5 spreads at the joining sites 13 and 14 after joining using the joining material 5.

In Embodiment 4 described above, although the joining material 5 is joined to only the protrusion 6 by heating and melting at the time of joining the crystal resonator plate 2, the upper lid member 3, and the lower lid member 4 as shown in FIG. 21, the joining material 5 will fill in the recesses 7 if the amount of the joining material 5 is changed and increased more than that used in Embodiment 4. In this case, an anchor effect also occurs in the recesses 7 and accordingly further increases the joining strength. Note that in Embodiment 4, although the multi-surface joining portion and the enlargement preventing portions are provided at both of the joining site 13 between the crystal resonator plate 2 and the lower lid member 3 and the joining site 14 between the crystal resonator plate 2 and the upper lid member 4, this is merely a preferable example and the present invention is not intended to be limited thereto. The above-described effects can be achieved if the multi-surface joining portion and the enlargement preventing portions are provided at at least one of the joining site 13 between the crystal resonator plate 2 and the lower lid member 3 and the joining site 14 between the crystal resonator plate 2 and the upper lid member 4.

In Embodiment 4, although the recesses 61 that are formed continuously to and outside the protrusion 6, which is the multi-surface joining portion, are provided as enlargement preventing portions, this is merely one embodiment and the present invention is not intended to be limited thereto. The above-described effects can be achieved if the enlargement preventing portions are provided outside the multi-surface joining portion.

Also, in Embodiment 4, although a single multi-surface joining portion and two enlargement preventing portions are provided for each of the lower lid member 3 and the upper lid member 4, the number of multi-surface joining portions and the number of enlargement preventing portions are not intended to be limited thereto and may be arbitrary numbers. Moreover, in Embodiment 4, although the recesses 7 are used as enlargement preventing portions, the present invention is not intended to be limited thereto, and enlargement preventing portions may, for example, be protruding wall portions that are formed outside the multi-surface joining portion as long as they prevent the joining material 5 from spreading in the main surface direction (planar direction) on the one main surface 31 of the lower lid member 3, the one main surface 41 of the upper lid member 4, and both of the main surfaces 21 and 22 of the crystal resonator plate 2. In other words, as is obvious from the above-described specific examples of the enlargement preventing portions in which the recesses 7 or the protruding wall portions have been described, the enlargement preventing portions are preferably formed to have unevenness in a direction perpendicular to the main surface direction (or in an approximately vertical direction).

As described above, synergistic effects produced by surface roughening of the joining region of the lower lid member 3 and the upper lid member 4 where the crystal resonator plate 2 is joined, and the provision of the multi-surface joining portion and the enlargement preventing portions in the lower lid member 3 and the upper lid member 4 improve the joining strength between the crystal resonator plate 2, and the lower lid member 3 and the upper lid member 4 via the joining material 5.

Embodiment 5

Figure 22:
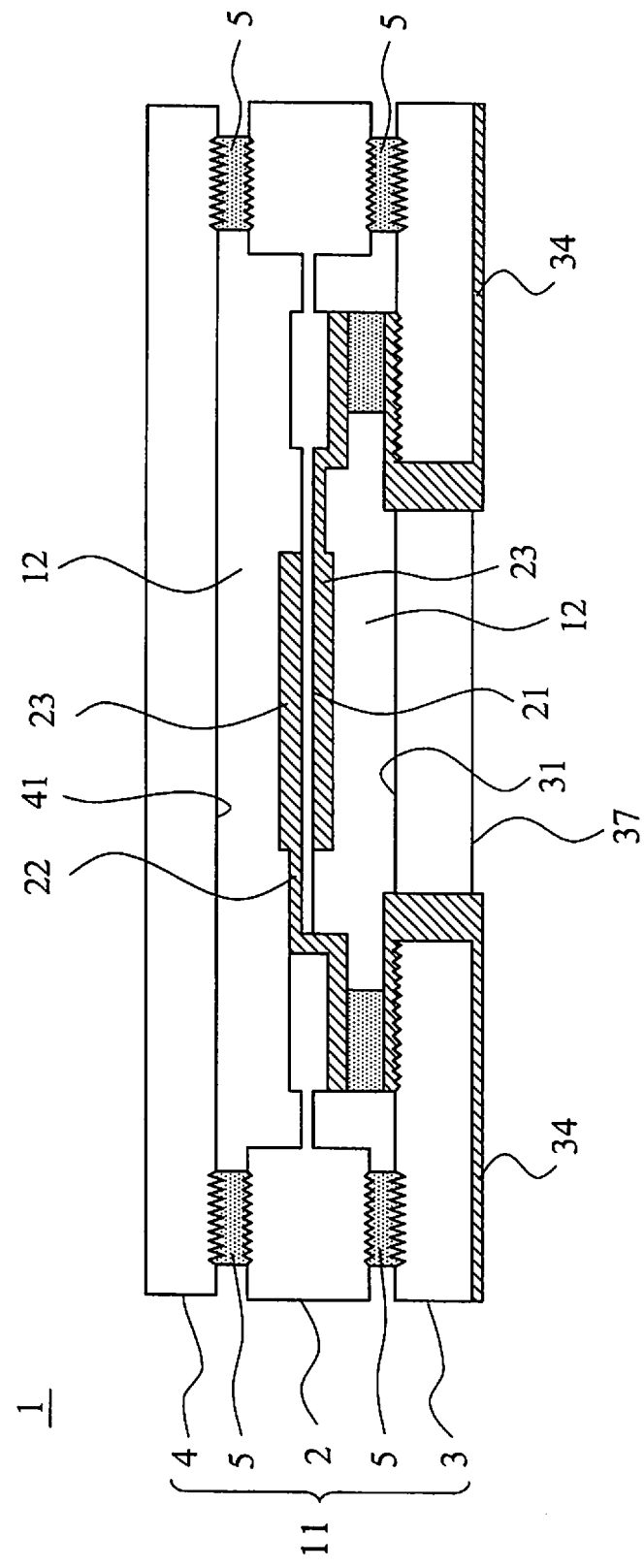
FIG. 22 is a schematic cross-sectional diagram of a crystal resonator taken along the long side thereof according to Embodiment 5 of the present invention.

Embodiment 5 according to the present invention will be described with reference to FIG. 22, taking the example of a crystal resonator using a crystal resonator plate as a piezoelectric resonator plate as in Embodiment 1 described above. FIG. 22 is a cross-sectional view of a crystal resonator 1 taken along the long side of a crystal resonator plate 2 according to Embodiment 5. Note that, in Embodiment 5, the same reference numerals have been given to constituent members that are the same as in Embodiment 1, and parts of descriptions thereof have been omitted. Also, parts of the configuration of Embodiment 5 that are the same as those of Embodiment 1 have similar effects to those of Embodiment 1. Accordingly, the following description of Embodiment 5 focuses on differences from Embodiment 1.

As shown in FIG. 22, the substrates of both main surfaces 201 and 202 of a frame portion 28, which are joining regions of the crystal resonator plate 2, have roughened surfaces in Embodiment 5. The substrate of a joining region (one main surface 41) of the upper lid member 4 and the substrate of a joining region (one main surface 31) of the lower lid member 3 also have roughened surfaces. The roughened substrate surfaces of the joining regions of the upper lid member 4 and the lower lid member 3 are formed rougher than the substrate surface of the joining region of the crystal resonator plate 2.

With such a configuration, performing surface roughening on the upper lid member 4 and the lower lid member 3, rather than on the crystal resonator plate 2 where the excitation electrodes 23, the extraction electrodes 24, and the like are formed, simplifies the surface roughening process. In the case of performing surface roughening on the crystal resonator plate 2 where metal films (electrode films) such as the excitation electrodes 23 and the extraction electrodes 24 are formed, it is necessary to protect such metal films as the excitation electrodes 23 and the extraction electrodes 24 and, in addition, various degrees of thermal hysteresis to be applied to the crystal resonator plate 2 can possibly affect the conditions of the excitation electrodes 23, the extraction electrodes 24, and the like. On the other hand, the upper lid member 4 and the lower lid member 3 have no such an electrode film as the excitation electrodes 23 and the extraction electrodes 24 formed, so it is possible to reduce the influences to be expected on various properties of the crystal resonator 1. Roughening the substrates of the joining regions of the upper lid member 4 and the lower lid member 3, together with a resultant anchor effect acting on the joining material 5, produces the crystal resonator 1 with good properties.

Figure 23:
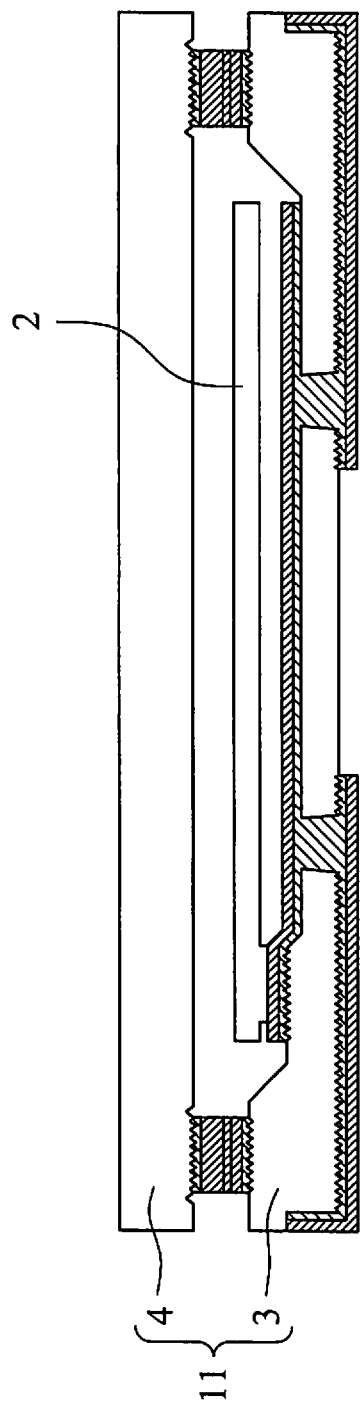
FIG. 23 is a schematic cross-sectional diagram of a crystal resonator taken along the long side thereof according to a modification of the embodiments of the present invention.
Figure 24:
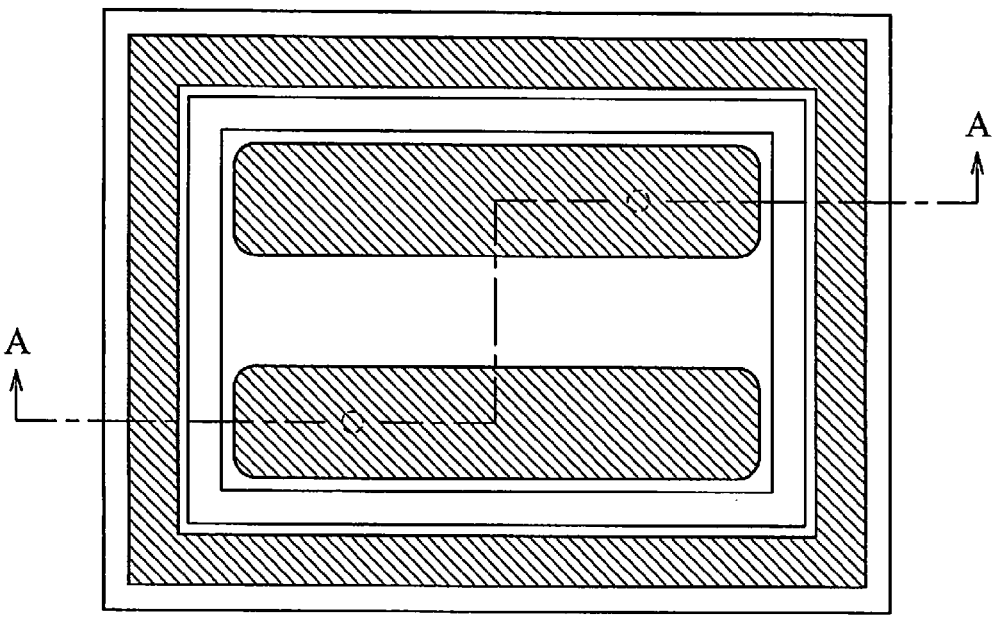
FIG. 24 is a schematic plan view of a lower lid member of the crystal resonator according to the modification of the embodiments of the present invention.

In the embodiments discussed above, although two flat-plate-like lid members that are rectangular in plan view are used, the present invention is not intended to be limited thereto, and the shape of lid members may be arbitrarily set as long as the excitation electrodes formed on the crystal resonator plate can be hermetically sealed with two lid members. For example, a configuration is possible in which concave portions of two concave lid members are hermetically joined to each other, facing a crystal resonator plate. Alternatively, a configuration as shown in FIGS. 23 and 24 is also possible in which a package 11 is constituted by a solid-plate upper lid member 4 and a box-like lower lid member 3, and a crystal resonator plate 2 located on the lower lid member 3 is hermetically sealed in the package 11. FIG. 24 is a schematic plan view of such a lower lid member 3, and FIG. 23 shows the cross-section of the lower lid member 3 taken along line A-A in FIG. 24. In the embodiment shown in FIGS. 23 and 24, surface roughening is performed on a joining region of the upper lid member 4 where the lower lid member 3 is joined, a joining region of the lower lid member 3 where the upper lid member 4 is joined, a joining region of the lower lid member 3 where the crystal resonator plate 2 is joined electromechanically, and a joining region of the lower lid member 3 where an external connection terminal electrically connected to an external member is formed.

Although the surface-mount crystal resonator is taken as an example in the embodiment of the present invention, the present invention is also applicable to a manufacturing method for other surface-mount piezoelectric resonator devices used in electronic equipment or the like, such a crystal filter, and a crystal oscillator incorporating a crystal resonator in electronic components such as an integrated circuit.

The present invention can be reduced to practice in various other forms without departing from its spirit or essential features. For this reason, the above-described exemplary embodiments are to all intents and purposes merely illustrative and should not be construed as limiting. The scope of the present invention is defined by the claims and is not in any way restricted by the descriptions of the specification. Furthermore, all variations and modifications of the claims within the scope of equivalency fall within the scope of the present invention.

Also, this application claims prior right on the basis of Japanese Patent Application 2008-326851 filed in Japan on Dec. 24, 2008, the content of which is hereby incorporated in its entirety by reference herein.

INDUSTRIAL APPLICABILITY

The present invention is preferable for the mass production of piezoelectric resonator devices.

The invention claimed is:

1. A manufacturing method for a piezoelectric resonator device,
wherein the piezoelectric resonator comprises a piezoelectric resonator plate where an excitation electrode is formed, and an upper lid member and a lower lid member that hermetically seals the excitation electrode, the piezoelectric resonator plate having a joining region where the upper lid member is joined and a joining region where the lower lid member is joined on front and back main surfaces, the upper lid member having a region on one main surface where the piezoelectric resonator plate is joined, the lower lid member having a region on one main surface where the piezoelectric resonator plate is joined, wherein the piezoelectric resonator plate and the region of the upper lid member are joined to each other via a joining material, and the piezoelectric resonator plate and the region of the lower lid member are joined to each other via a joining material, the manufacturing method comprising:
a metal film formation step of laminating a metal film constituted by at least two types of metals on at least one of a substrate of the joining region of the piezoelectric resonator plate, a substrate of the region of the upper lid member, and a substrate of the region of the lower lid member;
a diffusion step of promoting metal diffusion inside the metal film by heat processing after the metal film formation step; and
an etching step of roughening a surface of the substrate of the at least one of the piezoelectric resonator plate, the upper lid member, and the lower lid member, by performing wet etching with an etchant caused to penetrate into the metal film obtained after the diffusion step and thereby forming a large number of micropores in the surface of the substrate of the at least one of the piezoelectric resonator plate, the upper lid member, and the lower lid member.

2. The manufacturing method for the piezoelectric resonator device according to claim 1, wherein
the upper lid member and the lower lid member are made of crystal or glass,
the piezoelectric vibration plate is made of crystal,
the metal film formation step involves forming the metal film by forming a Cr layer on the substrate of at least one of the upper lid member, the lower lid member, and the piezoelectric resonator plate and laminating an Au layer on the Cr layer, so as to form a two-layer configuration of the Cr layer and the Au layer, and
the diffusion step involves roughening the surface of the substrate by diffusing Cr in the Cr layer into Au in the Au layer, performing wet etching using the etchant that is corrosive to the Cr and the crystal, and thereby forming the large number of micropores in the surface of the substrate of the at least one of the upper lid member, the lower lid member, and the piezoelectric resonator plate.

3. A manufacturing method for a piezoelectric resonator device,
wherein the piezoelectric resonator device comprises a piezoelectric resonator plate where an excitation electrode is formed, and an upper lid member and a lower lid member that hermetically seals the excitation electrode,
the piezoelectric resonator plate having a joining region where the lower lid member is joined on one main surface, the upper lid member having a joining region on one main surface where the lower lid member is joined, the lower lid member having on one main surface a joining region where the upper lid member is joined and a joining region where the piezoelectric resonator plate is joined, wherein the joining region of the upper lid member and the joining region of the lower lid member where the upper lid member is joined are joined to each other via a joining material, and the joining region of the piezoelectric resonator plate and the joining region of the lower lid member where the piezoelectric resonator plate is joined are joined to each other via a joining material,
the manufacturing method comprising;
a metal film formation step of laminating a metal film constituted by at least two types of metals on at least one of a substrate of the joining region of the piezoelectric resonator plate where the lower lid member is joined, a substrate of the joining region of the upper lid member where the lower lid member is joined, and a substrate of the joining region of the lower lid member where the upper lid member is joined and where the piezoelectric resonator plate is joined;
a diffusion step of promoting metal diffusion inside the metal film by heat processing after the metal film formation step; and
an etching step of roughening a surface of the substrate of the at least one of the piezoelectric resonator plate, the upper lid member, and the lower lid member, by performing wet etching with an etchant caused to penetrate into the metal film obtained after the diffusion step and thereby forming a large number of micropores in the surface of the substrate of the at least one of the piezoelectric resonator plate, the upper lid member, and the lower lid member.

4. The manufacturing method for the piezoelectric resonator device according to claim 3, wherein
the upper lid member and the lower lid member are made of crystal or glass,
the piezoelectric vibration plate is made of crystal,
the metal film formation step involves forming the metal film by forming a Cr layer on the substrate of the at least one of the upper lid member, the lower lid member, and the piezoelectric vibration plate and laminating an Au layer on the Cr layer, so as to form a two-layer configuration of the Cr layer and the Au layer, and
the diffusion step involves roughening the surface of the substrate by diffusing Cr in the Cr layer into Au in the Au layer, performing wet etching using the etchant that is corrosive to the Cr and the crystal, and thereby forming the large number of micropores in the surface of the substrate of the at least one of the upper lid member, the lower lid member, and the piezoelectric vibration plate.

5. A method for etching a constituent member of a piezoelectric vibration device,
wherein the constituent member has a joining region on at least one main surface where an external member is joined,
the method comprising:
a metal film formation step of laminating a metal film constituted by at least two types of metals on a substrate of the joining region of the constituent member;
a diffusion step of promoting metal diffusion inside the metal film by heat processing after the metal film formation step; and
an etching step of roughening a surface of the substrate by performing wet etching with an etchant caused to penetrate into the metal film obtained after the diffusion step and thereby forming a large number of micropores in the surface of the substrate.

6. The etching method according to claim 5, wherein the two types of metal are Cu and Au.

* * * * *